United States Patent
Salcedo et al.

(10) Patent No.: US 10,861,845 B2
(45) Date of Patent: Dec. 8, 2020

(54) ACTIVE INTERFACE RESISTANCE MODULATION SWITCH

(71) Applicant: ANALOG DEVICES, INC., Norwood, MA (US)

(72) Inventors: Javier Alejandro Salcedo, North Billerica, MA (US); Srivatsan Parthasarathy, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 690 days.

(21) Appl. No.: 15/370,912

(22) Filed: Dec. 6, 2016

(65) Prior Publication Data

US 2018/0158814 A1    Jun. 7, 2018

(51) Int. Cl.
*H01L 27/02* (2006.01)
*H02H 9/04* (2006.01)

(52) U.S. Cl.
CPC ...... *H01L 27/0285* (2013.01); *H01L 27/0255* (2013.01); *H01L 27/0262* (2013.01); *H02H 9/046* (2013.01)

(58) Field of Classification Search
CPC .. H02H 9/04–046; H01L 27/248–0296; H01L 27/0262
See application file for complete search history.

(56) References Cited

U.S. PATENT DOCUMENTS

| | | | |
|---|---|---|---|
| 5,400,202 A * | 3/1995 | Metz | H01L 27/0251 361/111 |
| 5,436,786 A | 7/1995 | Pelly et al. | |
| 5,682,047 A * | 10/1997 | Consiglio | H01L 27/0251 257/133 |
| 5,719,733 A | 2/1998 | Wei et al. | |
| 5,748,425 A | 5/1998 | Gutsch et al. | |
| 5,835,328 A | 11/1998 | Maloney et al. | |

(Continued)

FOREIGN PATENT DOCUMENTS

| | | |
|---|---|---|
| CN | 1438704 A | 8/2003 |
| CN | 101273507 A | 9/2008 |

(Continued)

OTHER PUBLICATIONS

Translation for CN 104283201. Jan. 14, 2015. (Year: 2015).*

(Continued)

*Primary Examiner* — Jared Fureman
*Assistant Examiner* — Christopher J Clark
(74) *Attorney, Agent, or Firm* — Knobbe, Martens, Olson & Bear, LLP

(57) ABSTRACT

In certain configurations, an input/output (IO) interface of a semiconductor chip includes a pin, an interface switch connected to the pin, and an overstress detection and active control circuit that controls a resistance of the interface switch with active feedback. The overstress detection and active control circuit increases a resistance of the interface switch in response to detection of a transient overstress event between a first node and a second node. Accordingly, the overstress detection and active control circuit provides separate detection and logic control to selectively modify the resistance of the interface switch such that the interface switch operates with low resistance during normal operating conditions and with high resistance during overstress conditions.

20 Claims, 14 Drawing Sheets

(56) References Cited

U.S. PATENT DOCUMENTS

| | | | |
|---|---|---|---|
| 5,852,540 A * | 12/1998 | Haider | H02H 9/046 361/111 |
| 5,870,268 A | 2/1999 | Lin et al. | |
| 5,973,341 A | 10/1999 | Letavic et al. | |
| 6,369,994 B1 * | 4/2002 | Voldman | H01L 27/0251 361/56 |
| 6,429,489 B1 | 8/2002 | Botula et al. | |
| 6,442,008 B1 | 8/2002 | Anderson | |
| 6,614,633 B1 | 9/2003 | Kohno | |
| 6,768,616 B2 * | 7/2004 | Mergens | H01L 27/0251 257/355 |
| 6,798,629 B1 * | 9/2004 | Proebsting | H01L 27/0266 361/111 |
| 6,828,842 B2 * | 12/2004 | Saito | H01L 27/11 257/E27.081 |
| 6,861,680 B2 | 3/2005 | Ker et al. | |
| 7,064,393 B2 | 6/2006 | Mergens et al. | |
| 7,102,862 B1 | 9/2006 | Lien et al. | |
| 7,106,563 B2 | 9/2006 | Lai et al. | |
| 7,285,828 B2 | 10/2007 | Salcedo et al. | |
| 7,545,614 B2 | 6/2009 | Traynor et al. | |
| 7,566,914 B2 | 7/2009 | Salcedo et al. | |
| 7,601,991 B2 | 10/2009 | Salcedo et al. | |
| 7,706,113 B1 | 4/2010 | Lien et al. | |
| 7,738,222 B2 | 6/2010 | Deutschmann et al. | |
| 8,044,457 B2 | 10/2011 | Salcedo et al. | |
| 8,222,698 B2 | 7/2012 | Salcedo et al. | |
| 8,248,741 B2 | 8/2012 | Barrow | |
| 8,320,091 B2 | 11/2012 | Salcedo et al. | |
| 8,345,394 B2 | 1/2013 | Zhao et al. | |
| 8,368,116 B2 | 2/2013 | Salcedo et al. | |
| 8,416,543 B2 | 4/2013 | Salcedo | |
| 8,422,187 B2 | 4/2013 | Parthasarathy et al. | |
| 8,432,651 B2 | 4/2013 | Salcedo et al. | |
| 8,462,477 B2 | 6/2013 | Modica et al. | |
| 8,466,489 B2 | 6/2013 | Salcedo et al. | |
| 8,553,380 B2 | 10/2013 | Salcedo | |
| 8,564,065 B2 | 10/2013 | Donovan et al. | |
| 8,582,261 B2 | 11/2013 | Salcedo et al. | |
| 8,592,860 B2 | 11/2013 | Salcedo et al. | |
| 8,610,251 B1 | 12/2013 | Salcedo | |
| 8,637,899 B2 | 1/2014 | Salcedo | |
| 8,649,134 B2 | 2/2014 | Smith | |
| 8,665,570 B2 | 3/2014 | Jalilizeinali et al. | |
| 8,665,571 B2 * | 3/2014 | Salcedo | H02H 9/046 361/118 |
| 8,680,620 B2 | 3/2014 | Salcedo et al. | |
| 8,723,227 B2 | 5/2014 | Salcedo et al. | |
| 8,730,630 B2 | 5/2014 | Parthasarathy et al. | |
| 8,759,871 B2 | 6/2014 | Song et al. | |
| 8,773,826 B2 | 7/2014 | Althlaguirre et al. | |
| 8,796,729 B2 | 8/2014 | Clarke et al. | |
| 8,860,080 B2 | 10/2014 | Salcedo | |
| 8,946,822 B2 | 2/2015 | Salcedo et al. | |
| 8,947,841 B2 | 2/2015 | Salcedo et al. | |
| 8,958,187 B2 | 2/2015 | Parthasarathy et al. | |
| 9,006,781 B2 | 4/2015 | Salcedo et al. | |
| 9,013,845 B1 | 4/2015 | Karp | |
| 9,088,256 B2 * | 7/2015 | Cosgrave | H03F 1/52 |
| 9,123,540 B2 | 9/2015 | Salcedo et al. | |
| 9,147,677 B2 | 9/2015 | Salcedo et al. | |
| 9,171,832 B2 | 10/2015 | Salcedo et al. | |
| 9,184,098 B2 | 11/2015 | Salcedo et al. | |
| 9,275,991 B2 * | 3/2016 | Salcedo | H01L 27/0921 |
| 9,293,912 B2 | 3/2016 | Parthasarathy et al. | |
| 9,368,485 B1 | 6/2016 | Chu | |
| 9,450,402 B1 | 9/2016 | Huang et al. | |
| 9,478,608 B2 | 10/2016 | Salcedo et al. | |
| 9,634,482 B2 | 4/2017 | Parthasarathy et al. | |
| 9,831,233 B2 | 11/2017 | Salcedo et al. | |
| 10,158,029 B2 | 12/2018 | Parthasarathy et al. | |
| 10,177,566 B2 | 1/2019 | Zhao et al. | |
| 10,199,369 B2 | 2/2019 | Parthasarathy et al. | |
| 10,249,609 B2 | 4/2019 | Salcedo et al. | |
| 10,734,806 B2 | 8/2020 | Zhao et al. | |
| 2002/0153571 A1 | 10/2002 | Mergens et al. | |
| 2003/0043523 A1 | 3/2003 | Hung et al. | |
| 2003/0201457 A1 | 10/2003 | Lin et al. | |
| 2003/0214769 A1 * | 11/2003 | Nishikawa | H01L 27/0266 361/56 |
| 2004/0114288 A1 | 6/2004 | Cheng et al. | |
| 2004/0164356 A1 | 8/2004 | Mergens et al. | |
| 2005/0286188 A1 * | 12/2005 | Camp | H01L 27/0262 361/56 |
| 2006/0050452 A1 | 3/2006 | Oguzman et al. | |
| 2006/0103998 A1 | 5/2006 | Smith | |
| 2006/0285418 A1 | 12/2006 | Aoki | |
| 2007/0076338 A1 | 4/2007 | Traynor et al. | |
| 2007/0195472 A1 * | 8/2007 | Kwak | H01L 27/0266 361/56 |
| 2007/0267701 A1 * | 11/2007 | Sung | H01L 27/0266 257/365 |
| 2008/0106837 A1 | 5/2008 | Jang | |
| 2008/0247102 A1 | 10/2008 | Vinson | |
| 2008/0304191 A1 | 12/2008 | Riviere et al. | |
| 2008/0316659 A1 | 12/2008 | Oguzman et al. | |
| 2009/0122452 A1 * | 5/2009 | Okushima | H01L 27/0262 361/56 |
| 2009/0140802 A1 * | 6/2009 | Kitagawa | H03F 3/45192 330/9 |
| 2010/0148797 A1 | 6/2010 | Ker et al. | |
| 2010/0149701 A1 | 6/2010 | Drapkin et al. | |
| 2010/0214704 A1 | 8/2010 | Lamey et al. | |
| 2010/0214706 A1 | 8/2010 | Crespo et al. | |
| 2010/0328827 A1 | 12/2010 | Lai et al. | |
| 2011/0198678 A1 * | 8/2011 | Ker | H01L 27/0285 257/296 |
| 2011/0222196 A1 | 9/2011 | Smith | |
| 2011/0235228 A1 | 9/2011 | Salcedo et al. | |
| 2012/0002333 A1 | 1/2012 | Soldner et al. | |
| 2012/0002337 A1 | 1/2012 | Parthasarathy et al. | |
| 2012/0057260 A1 | 3/2012 | Poulton | |
| 2012/0176708 A1 | 7/2012 | Tsai | |
| 2012/0180008 A1 | 7/2012 | Gist et al. | |
| 2012/0257317 A1 * | 10/2012 | Abou-Khalil | H01L 27/0262 361/56 |
| 2012/0320483 A1 | 12/2012 | Salcedo et al. | |
| 2013/0155558 A1 | 6/2013 | Bourgeat et al. | |
| 2014/0078624 A1 | 3/2014 | Nagamatsu et al. | |
| 2014/0133055 A1 | 5/2014 | Parthasarathy et al. | |
| 2014/0185168 A1 * | 7/2014 | Kunz, Jr. | H02H 9/046 361/56 |
| 2014/0355157 A1 * | 12/2014 | Huang | H02H 9/046 361/56 |
| 2015/0263505 A1 * | 9/2015 | Takada | H02H 9/046 361/56 |
| 2015/0270258 A1 * | 9/2015 | Dabral | H01L 27/0285 361/56 |
| 2015/0276854 A1 * | 10/2015 | Cejka | G01R 31/2818 324/762.02 |
| 2015/0311700 A1 * | 10/2015 | Lee | H02H 9/04 361/56 |
| 2016/0020603 A1 | 1/2016 | Parthasarathy et al. | |
| 2016/0087429 A1 | 3/2016 | Wang et al. | |
| 2016/0204096 A1 | 7/2016 | Zhao et al. | |
| 2016/0261110 A1 | 9/2016 | Ivanov et al. | |
| 2016/0285255 A1 * | 9/2016 | O'Donnell | H02H 9/02 |
| 2016/0300830 A1 | 10/2016 | Salcedo et al. | |
| 2016/0336740 A1 | 11/2016 | Parthasarathy et al. | |
| 2016/0336744 A1 * | 11/2016 | Parthasarathy | H02H 9/046 |
| 2017/0243862 A1 | 8/2017 | Parthasarathy et al. | |
| 2017/0256534 A1 | 9/2017 | Parthasarathy et al. | |
| 2017/0317019 A1 | 11/2017 | Salcedo et al. | |
| 2017/0366002 A1 * | 12/2017 | Zhao | H02H 9/046 |
| 2018/0006448 A1 | 1/2018 | Glaser et al. | |
| 2018/0026440 A1 * | 1/2018 | Zhao | H02H 9/005 361/56 |
| 2018/0159323 A1 * | 6/2018 | Huang | H02H 9/046 |
| 2018/0211951 A1 | 7/2018 | Luo et al. | |
| 2018/0226788 A1 | 8/2018 | Salcedo et al. | |

(56) References Cited

U.S. PATENT DOCUMENTS

2018/0287378 A1 10/2018 Sithanandam
2019/0131787 A1 5/2019 He et al.
2020/0227914 A1 7/2020 Salcedo et al.

FOREIGN PATENT DOCUMENTS

| CN | 101297451 A | 10/2008 |
|---|---|---|
| CN | 101626154 A | 1/2010 |
| CN | 101707368 A | 5/2010 |
| CN | 201536104 U | 7/2010 |
| CN | 102118024 A | 7/2011 |
| CN | 103217720 A | 7/2013 |
| CN | 103248033 A | 8/2013 |
| CN | 103401229 A | 11/2013 |
| CN | 103795026 A | 5/2014 |
| CN | 203607843 U | 5/2014 |
| CN | 103839941 | 6/2014 |
| CN | 103915828 A | 7/2014 |
| CN | 104283201 A | 1/2015 |
| CN | 104753055 | 7/2015 |
| EP | 1617477 A1 | 1/2006 |
| EP | 1048078 B1 | 5/2010 |
| TW | 577166 B | 2/2004 |
| WO | WO 03/063203 A2 | 7/2003 |
| WO | WO 2009/050641 | 4/2009 |
| WO | WO 2014/180184 A1 | 11/2014 |
| WO | WO 2017/078676 A1 | 5/2017 |

OTHER PUBLICATIONS

Office Action received in CN Application No. 201711271836.5, dated Jan. 22, 2019, in 7 pages.

Salcedo et al., Electrostatic Discharge Protection Framework for Mixed-Signal High Voltage CMOS Applications. 9th International Conference on Solid-State and Integrated-Circuit Technology, Oct. 2008. 4 pages.

Salcedo et al., Monolithic ESD Protection for Distributed High Speed Applications in 28-nm CMOS Technology, IEEE 2014, 4 pages.

Chang et al., "High-k Metal Gate-bounded Silicon Controlled Rectifier for ESD Protection" Electrical Overstress / Electrostatic Discharge Symposium Proceedings 2012, in 7 pages.

Ker et al., "ESD protection design for CMOS RF integrated circuits using polysilicon diodes" Microelectronics Reliability 42(6):863-872, Jun. 2002, in 10 pages.

Ker et al., "SCR Device With Double-Triggered Technique for On-Chip ESD Protection in Sub-Quarter-Micron Silicided CMOS Processes" IEEE Transactions on Device and Materials Reliability, vol. 3, Issue 3, Sep. 2003, in 11 pages.

Zhang et al., "A Full-Chip ESD Protection Circuit Simulation and Fast Dynamic Checking Method Using Spice and ESD Behavior Models" IEEE Transactions on Computer-Aided Design of Integrated Circuits and Systems, vol. 38, Issue 3, Mar. 2019 in 10 pages.

\* cited by examiner

ACTIVE INTERFACE RESISTANCE MODULATION SWITCH

FIELD OF THE DISCLOSURE

Embodiments of the invention relate to electronic systems, and more particularly to, electrical overstress protection of input/output (IO) interfaces of integrated circuits.

BACKGROUND

Certain electronic systems can be exposed to transient overstress events, or electrical signals of short duration having rapidly changing voltage and high power. Transient overstress events can include, for example, electrical overstress (EOS) events and/or electrostatic discharge (ESD) events arising from the abrupt release of charge from an object or person to an electronic system.

Transient overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Apparatus and method for active interface resistance modulation switches are provided herein. In certain configurations, an input/output (IO) interface of a semiconductor chip includes a pin, an interface switch connected to the pin, and an overstress detection and active control circuit that controls a resistance of the interface switch with active feedback. The overstress detection and active control circuit increases a resistance of the interface switch in response to detection of a transient overstress event between a first node and a second node. Accordingly, the overstress detection and active control circuit provides separate detection and logic control to selectively modify the resistance of the interface switch such that the interface switch operates with low resistance during normal operating conditions and with high resistance during overstress conditions.

In one aspect, an integrated circuit with interface resistance modulation is provided. The integrated circuit includes a pin, a first interface switch electrically connected to the pin and having a resistance controlled by an interface resistance control signal, and an overstress detection and active control circuit configured to detect for presence of an overstress condition between a first reference voltage and a second reference voltage, and to control the interface resistance control signal to modulate a resistance of the first interface switch from a low resistance value to a high resistance value in response to detecting the overstress condition.

In another aspect, a method of providing actively-controlled overstress protection for an integrated circuit is provided. The method includes controlling a resistance of an interface switch that is connected to a pin using an interface resistance control signal, detecting for presence of an overstress condition between a first reference voltage and a second reference voltage, and modulating a resistance of the interface switch from a low resistance value to a high resistance value by controlling the interface resistance control signal in response to detecting the overstress condition.

In another aspect, a signal chain system on a package (SOP) is provided. The signal chain SOP includes a package substrate, and a data converter system on a chip (SOC) attached to the package substrate. The data converter SOC includes a signal pin, an analog-to-digital converter (ADC), an interface switch electrically connected between the signal pin and an input to the ADC, wherein a resistance of the interface switch is controlled by an interface resistance control signal, and an overstress detection and active control circuit configured to detect for presence of an overstress condition between a power supply voltage and a ground voltage, and to control the interface resistance control signal to modulate a resistance of the interface switch from a low resistance value to a high resistance value in response to detecting the overstress condition.

DETAILED DESCRIPTION

Figure 1A:
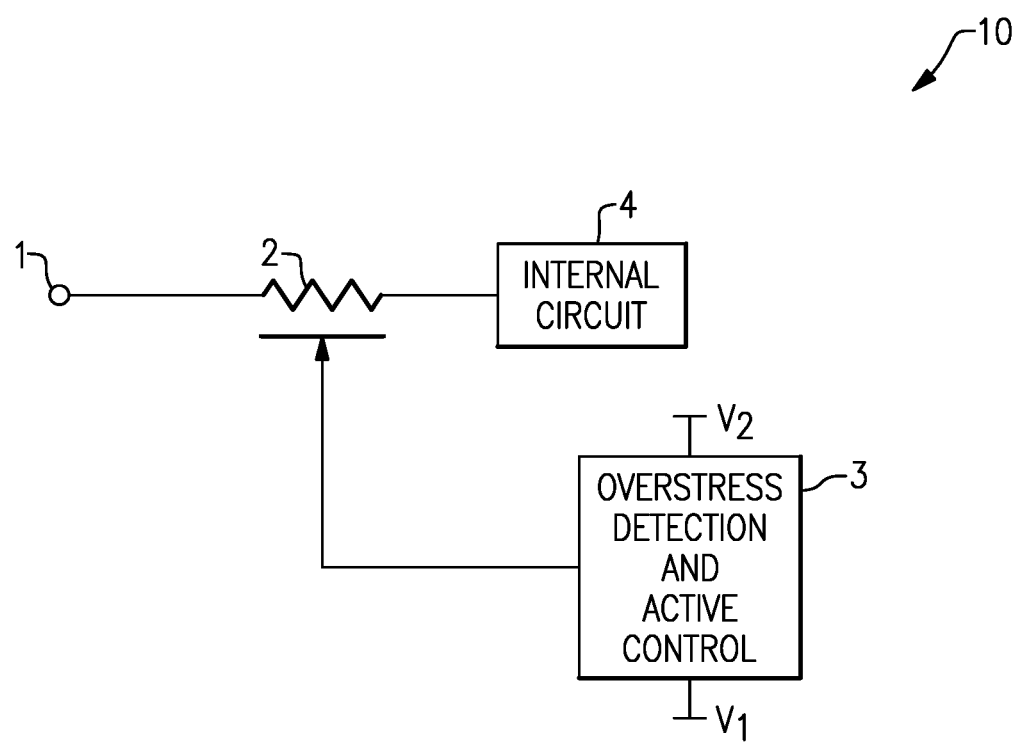
FIG. 1A is a schematic diagram of one embodiment of an IO interface having active feedback controlled interface switch resistance.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

An integrated circuit (IC) or semiconductor chip can include overstress protection circuits to provide protection from transient overstress events. To help guarantee that the IC is reliable, manufacturers can test the IC under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient overstress events, including electrostatic discharge (ESD) events, such as Human Body Model (HBM) and Field-Induced Charged Device Model (FiCDM) events.

An input/output (IO) interface of an IC can include a wide variety of pins or pads, including, for example, power supply pins, ground pins, and pins used for transmitting and/or receiving signals. In certain applications, one or more pins of an IO interface can be specified to operate with stringent specifications with respect to resistance and/or capacitance. For example, a pin of a high-speed and/or low noise signal interface can be specified to have low input resistance and/or small capacitive loading.

In response to stress conditions, the IC's overstress protection circuits activate to provide a discharge path that protects the IO interface and internal circuitry connected thereto from damage. Ideally, when the IO interface operates with normal voltage levels or conditions, the overstress protection circuits remain deactivated and do not hinder or degrade the IC's performance. However, parasitics of the overstress protection circuits provide resistance and/or capacitance that can adversely affect the signaling characteristics and/or performance of an IO interface.

The complexities in implementing an IO interface with overstress protection circuits can be exacerbated in configurations in which the IC is fabricated using a high performance semiconductor processing technology. For example, high-speed chip designs for emerging communications applications for the internet of things (IoT) and automotive electrification can be implemented on chips fabricated using advanced processing technologies, such as those providing device feature sizes of 28 nm or smaller and/or fin field-effect transistors (FinFETs).

In such high performance technologies, the inclusion of on-chip overstress protection circuits can significantly impact circuit performance by presenting parasitics that lower a data rate of the IO interface, thereby reducing or eliminating an edge in performance improvement offered by the technology.

In certain implementations herein, an IO interface of an IC includes a pin, an interface switch connected to the pin, and an overstress detection and active control circuit that controls a resistance of the interface switch with active feedback. The overstress detection and active control circuit increases a resistance of the interface switch in response to detection of a transient overstress event between a first node and a second node. Accordingly, the overstress detection and active control circuit provides separate detection and logic control to selectively modify the resistance of the interface switch such that the interface switch operates with low resistance during normal operating conditions and with high resistance during overstress conditions.

Thus, an interface switch can be actively controlled to provide impedance modulation at a pin of an IO interface. In one example, the resistance of an interface switch is modulated with active control from a desirable low resistance (for instance, less than about 500 mΩ) during normal IC operation to a high resistance (for instance, greater than about 10Ω) when the IC is subject to stress conditions. The independent interface modulation control can achieve protection of the IC's internal circuitry during overstress conditions without compromising high-speed performance metrics associated with interface signaling.

The teachings herein are applicable to a wide variety of IO interfaces for semiconductor chips, including, but not limited to, high speed interfaces and/or low noise interfaces. Example applications include, but are not limited to, data converter systems, automotive radar systems, and/or high speed signals chains, such as those used in internet of things (IOT) applications.

FIG. 1A is a schematic diagram of one embodiment of an IO interface 10 having active feedback controlled interface switch resistance. The IO interface 10 includes a pin 1, an interface switch 2, an overstress detection and active control circuit 3, and an internal circuit 4.

As shown in FIG. 1A, the interface switch 2 is electrically connected between the pin 1 and the internal circuit 4. Additionally, the interface switch 2 includes a control input that is controlled by an interface resistance control signal generated by the overstress detection and active control circuit 3. As shown in FIG. 1A, the overstress detection and active control circuit 3 is connected between a first reference voltage $V_1$ and a second reference voltage $V_2$. In one embodiment, the first reference voltage $V_1$ is a ground voltage and the second reference voltage $V_2$ is a power supply voltage. However, other implementations are possible.

For clarity of the figures, only one pin of the IO interface is shown in FIG. 1A. However, an IO interface typically includes additional pins. In certain implementations, the first reference voltage $V_1$ and/or the second reference voltage $V_2$ are provided by pins. For example, in one embodiment, the pin 1 corresponds to a signal pin, and the first reference voltage $V_1$ is provided by a ground pin and the second reference voltage $V_2$ is provided by a power supply pin.

The interface switch 2 controls an amount of impedance along an electrical path between the pin 1 and the internal circuit 4. During normal IC operating conditions or voltage levels, it is desirable for the interface switch 2 to operate with low resistance. For example, the pin 1 can correspond to pin used to transmit and/or receive high-speed signals. Additionally, the presence of resistance between the pin 1 and the internal circuit 4 can degrade signal quality, reduce maximum data rate, and/or increase circuit noise.

Although, no resistance or a relatively small resistance can be desirable between the pin 1 and the internal circuit 4, directly connecting the pin 1 to the internal circuit 4 can weaken the robustness of the IO interface 10 to overstress. For example, the internal circuit 4 can include voltage-sensitive circuitry, such as fine geometry MOS transistors and/or FinFETs that are susceptible to damage from relatively small amounts of overstress. Accordingly, directly connecting the pin 1 to the internal circuit 4 can result in the IC failing to meet specifications with respect to overstress and/or lower yield by increasing a number of parts damaged during manufacturing and/or handling.

Accordingly, although a resistance between the pin 1 and the internal circuit 4 can be undesirable from a signaling performance perspective, the resistance can also enhance the robustness of the IO interface 10 to overstress. For example, the resistance of the interface switch 2 can protect the internal circuit 4 from damage during an ESD event by helping to prevent charge from flowing into or out of the internal circuit 4.

The interface switch 2 can be implemented in a wide variety of ways. In certain embodiments, the interface switch 2 is implemented as a field-effect transistor (FET). For example, the interface switch 2 can be implemented as an n-type metal oxide semiconductor (NMOS) transistor, a p-type metal oxide semiconductor (PMOS) transistor, an n-type junction field-effect transistor (JFET) or a p-type JFET.

In the illustrated embodiment, the overstress detection and active control circuit 3 monitors a voltage difference between the first reference voltage $V_1$ and the second reference voltage $V_2$ to detect presence of a transient overstress event. Additionally, the overstress detection and control circuit 3 increases the resistance of the interface switch 2 in response to detecting overstress such that the interface switch 2 provides low resistance during normal operating conditions and high resistance during overstress conditions.

Accordingly, the overstress detection and active control circuit 3 provides resistance modulation at the interface pin 1. For example, the active control provided by the overstress detection and active control circuit 3 can change the resistance of the interface switch 2 over a wide range, such as two or more orders of magnitude.

In one example, the overstress detection and active control circuit 3 controls a resistance of the interface switch 2 to be less than about 500 mΩ during normal operation and to a resistance greater than about 10Ω in response to detection of overstress conditions. Thus, the resistance of the interface switch 2 can be modulated by several orders of magnitude over a short amount of time.

The overstress detection and active control circuit 3 selectively increases the resistance of the interface switch 2 based on whether or not presence of a transient overstress event between the first reference voltage $V_1$ and the second reference voltage $V_2$ is detected.

In certain configurations, the overstress detection and active control circuit 3 detects a rate of voltage change between the first reference voltage $V_1$ and the second reference voltage $V_2$, and controls the interface resistance control signal to increase the resistance of the interface switch 2 when a qualifying transient overstress event is detected. However, the overstress detection and active control circuit 3 can detect a transient overstress event based on a multitude of detection conditions indicative of the potential of a transient overstress event to damage sensitive electronics, including, but not limited to, measurements of power, voltage, current, and/or charge.

The overstress detection and active control circuit 3 can be implemented to detect positive polarity overstress events that cause a voltage of the second reference voltage $V_2$ to increase relative to the first reference voltage $V_1$ and/or negative polarity overstress events that cause a voltage of the second reference voltage $V_2$ to decrease relative to the first reference voltage $V_1$.

In certain implementations, the overstress detection and active control circuit 3 can transition the interface switch 2 from a low resistance/ON state to a high resistance/OFF state when the overstress detection and active control circuit 3 detects a rapidly changing voltage for a sufficient period of time between the first reference voltage $V_1$ and the second reference voltage $V_2$. For instance, the overstress detection and active control circuit 3 can be configured to activate for transient overstress events having a rate of voltage change in the range of about 0.1 V/ns to about 100 V/ns for a length of time in the range of about 1 ns to about 1000 ns. Stress Conditions can have a rise time in the order of 300 ps to 10 ns and reach current levels that can exceed 30 Amps peak, for instance, in worst-case harsh environment operation.

By controlling the interface switch 2 with active feedback, the benefits of both robust overstress protection and high-speed signaling performance can be achieved.

Figure 1B:
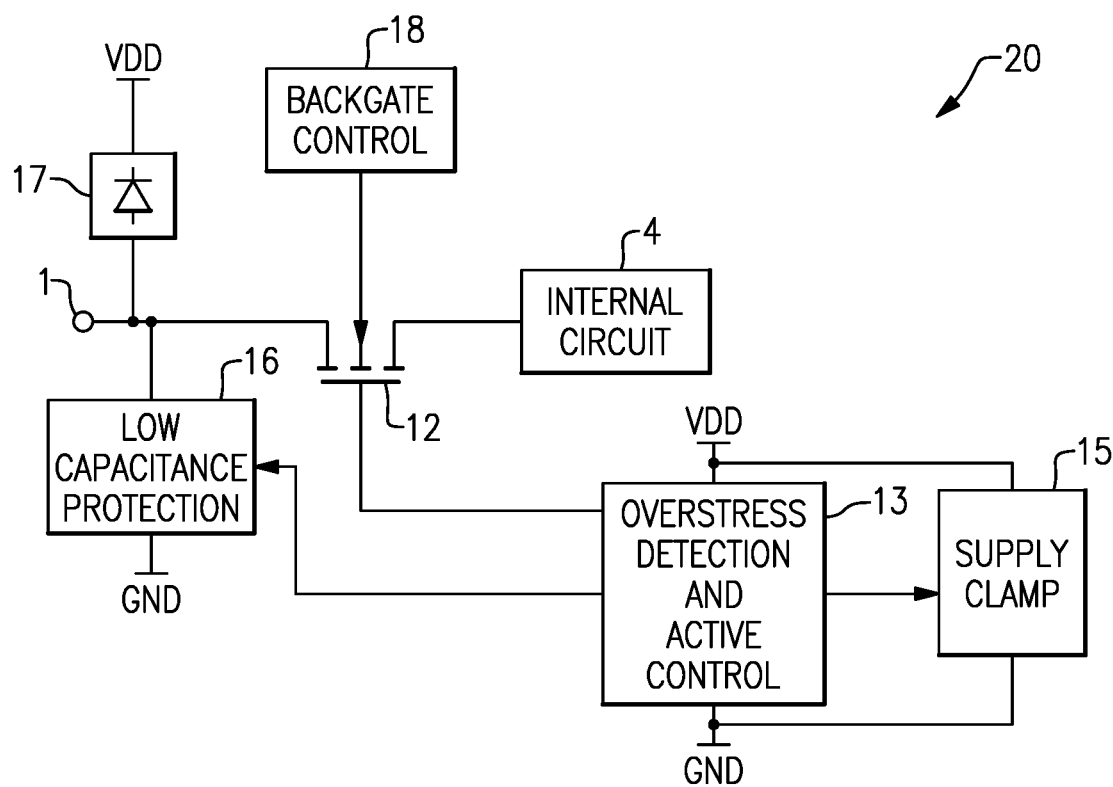
FIG. 1B is a schematic diagram of another embodiment of an IO interface having active feedback controlled interface switch resistance.

FIG. 1B is a schematic diagram of another embodiment of an IO interface 20 having active feedback controlled interface switch resistance. The IO interface 20 includes a pin 1, an internal circuit 4, an interface transistor switch 12, an overstress detection and active control circuit 13, a supply clamp 15, a low capacitance protection circuit 16, a diode-based protection circuit 17, and a back gate control circuit 18.

As shown in FIG. 1B, the interface transistor switch 12 is electrically connected between the pin 1 and the internal circuit 4, and thus includes a channel interposed between the pin 1 and the internal circuit 4. Additionally, the interface transistor switch 12 includes a body that receives a backgate voltage from the backgate control circuit 18, and a gate that receives an interface resistance control signal from the overstress detection and active control circuit 13.

The illustrated overstress detection and active control circuit 13 is electrically connected between a power supply voltage VDD and a ground voltage GND. In certain implementations, the power supply voltage VDD and the ground voltage GND are received on a power supply pin and a ground pin, respectively. In certain embodiments, the overstress detection and active control circuit 13 can be implemented to detect positive polarity overstress events that increase the power supply voltage VDD relative to the ground voltage GND and/or negative polarity overstress events that decrease the power supply voltage VDD relative to the ground voltage GND.

As shown in FIG. 1B, the illustrated overstress detection and active control circuit 13 generates a multitude of control signals based on whether or not presence of a transient overstress event is detected between the power supply voltage VDD and the ground voltage GND.

For example, the overstress detection and active control circuit 13 generates the interface resistance control signal for the interface transistor switch 12, which is used to selectively increase the interface transistor switch's resistance when overstress conditions are present. In certain implementations, the pin 1 corresponds to a signal pin, and thus the overstress detection and active control circuit 13 can be used to increase input resistance of the signal pin in response to detecting an overstress event between power and ground.

As shown in FIG. 1B, the overstress detection and active control circuit 13 also generates a clamp activation signal for the supply clamp 15. The clamp activation signal is operable to selectively activate or turn on the supply clamp 15 to provide a discharge path from the power supply voltage VDD to the ground voltage GND. Accordingly, the illustrated power supply clamp 15 is actively controlled. An actively controlled power supply clamp is turned on by a control signal that is generated by monitoring for electrical conditions associated with overstress. By implementing a supply clamp with active control, relatively fast activation times, relatively low static power dissipation, and/or relatively compact area can be achieved relative to a power supply clamp that relies on native junction breakdown to provide clamping.

The overstress detection and active control circuit 13 further generates a trigger signal for the low capacitance protection circuit 16. As will be discussed further below, the trigger signal can temporarily modify the electrical characteristics of the low capacitance protection circuit 16, such as trigger voltage, holding voltage, and/or turn-on speed, to enhance protection characteristics at the pin 1. Although activating the trigger signal to enhance protection can temporarily degrade signaling performance by increasing leakage current and/or parasitic capacitance, the signaling performance degradation is limited to time periods in which the overstress detection and active control circuit 13 detects overstress. Accordingly, the trigger signal is dynamically activated to achieve the advantages of both robust overstress protection and excellent signaling performance.

As shown in FIG. 1B, the low capacitance protection circuit 16 is electrically connected between the pin 1 and the ground voltage GND. The low capacitance protection circuit 16 can also be referred to herein as a secondary protection circuit.

In the illustrated embodiment, the diode-based protection circuit 17 includes an anode electrically connected to the pin 1 and a cathode electrically connected to the power supply voltage VDD.

The diode-based protection circuit 17 and the low capacitance protection circuit 16 operate to provide auxiliary or secondary protection to the pin 1 during an overstress event. For example, the diode-based protection circuit 17 and the low capacitance protection circuit 16 operate to shunt charge present at the pin 1 to prevent voltage build-up that may otherwise cause damage to the IO interface 20, including, for example, damage to the interface transistor switch 12 itself. Absent a mechanism to shunt charge present at the pin 1, the overstress detection and active control circuit 13 can turn off the interface transistor switch 12 in response to an overstress event, and the pin voltage can build up.

With continuing reference to FIG. 1B, when an overstress condition results in the voltage of the pin 1 increasing with respect to the power supply voltage VDD, the diode-based protection circuit 17 can become forward biased to provide a discharge path to the power supply voltage VDD. Additionally, when an overstress condition is present between the pin 1 and the ground voltage GND, the low capacitance protection circuit 16 can activate to provide a discharge path to the ground voltage GND.

The interface transistor switch 12 controls an amount of resistance between the pin 1 and the internal circuit 4. When the pin 1 operates with normal voltage levels, it is desirable for the interface transistor switch 12 to provide low resistance. For example, the pin 1 can correspond to pin used to transmit and/or receive high-speed signals, and the resistance of the interface switch 12 can degrade signal quality, reduce maximum signaling speed, and/or increase circuit noise. However, from a standpoint of overstress protection, resistance of the interface transistor switch 12 is desirable to provide resistance that helps prevent charge from flowing into or out of the internal circuit 4 during a transient overstress event.

By controlling the gate of the interface transistor switch 12 with active feedback from the overstress detection and active control circuit 13, the resistance of the interface transistor switch 12 is dynamically controlled. In particular, the overstress detection and active control circuit 13 controls the channel resistance of the interface transistor switch 12 to provide resistance modulation based on whether the overstress detection and active control circuit 13 detects an overstress condition. In one example, the channel resistance of the interface transistor switch 12 is modulated from a desirable low resistance (for instance, less than about 500 mΩ) when no overstress condition is detected to a high resistance (for instance, greater than about 10Ω) when an overstress condition is detected.

In the illustrated embodiment, the backgate control circuit 18 generates a backgate or body voltage for the interface transistor switch 12. In certain implementations, the interface transistor switch 12 can include parasitic drain-to-body and/or source-to-body diodes that can become forward biased under certain biasing conditions.

The backgate control circuit 18 can control the backgate voltage to enhance the performance of the interface transistor switch 12. In one embodiment, the backgate control circuit 18 controls the body voltage of an n-type interface transistor switch based on the lesser of the source voltage and the drain voltage to maintain the parasitic diodes turned off. In another embodiment, an interface transistor switch is implemented as a p-type device rather than an n-type device, and the backgate control circuit 18 controls the body voltage of the p-type interface transistor switch based on the greater of the transistor's source voltage and the transistor's drain voltage.

In certain implementations, the backgate control circuit 18 receives an active control signal from the overstress detection and active control circuit 13. For example, when the active control signal indicates that an overstress condition is present, the backgate control circuit 18 can change the body voltage to increase the interface transistor switch's resistance via the body effect. Accordingly, in certain implementations, the channel resistance of an interface transistor switch can be increased during an overstress condition by controlling both a gate voltage and a body voltage.

Figure 1C:
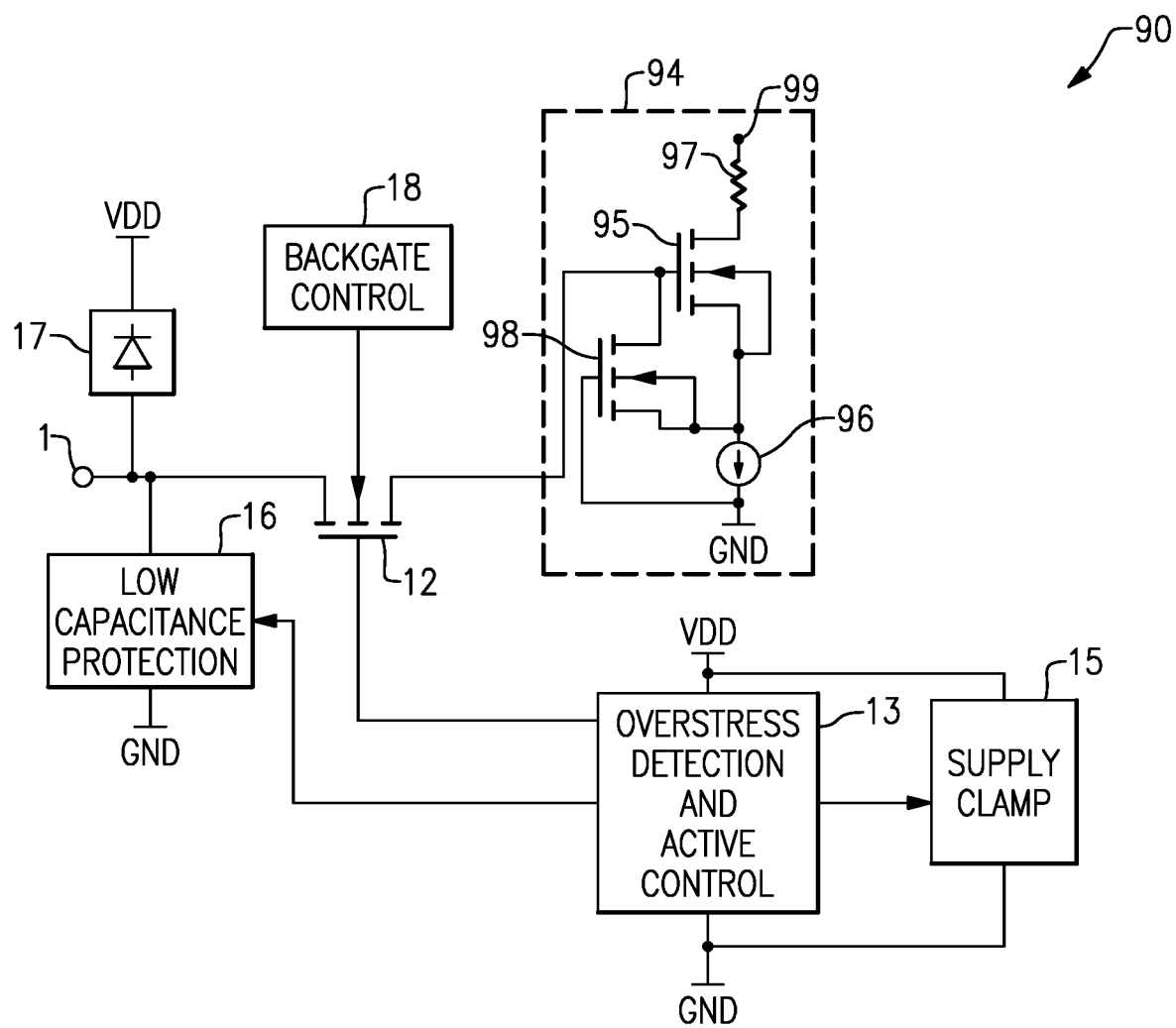
FIG. 1C is a schematic diagram of another embodiment of an IO interface having active feedback controlled interface switch resistance.

FIG. 1C is a schematic diagram of another embodiment of an IO interface 90 having active feedback controlled interface switch resistance. The IO interface 90 includes a pin 1, an internal circuit 94, an interface transistor switch 12, an overstress detection and active control circuit 13, a supply clamp 15, a low capacitance protection circuit 16, a diode-based protection circuit 17, and a back gate control circuit 18.

The IO interface 90 of FIG. 1C is similar to the IO interface 30 of FIG. 1B, except that the IO interface 90 of FIG. 1C includes a specific implementation of an internal circuit. In particular, the internal circuit 94 of FIG. 1C includes an input transistor 95, a current source 96, a resistor 97, a protection transistor 98, and an output node 99.

The resistor 97, the input transistor 95, and the current source 96 are electrically connected in series between the output node 99 and the ground voltage GND. The current source 96 controls a bias current flowing through the input transistor 95 and the resistor 97. When the interface transistor switch 12 is turned on, the gate of the input transistor 95 is controlled by the voltage of the pin 1, and thus the voltage of the output node 99 changes based on the voltage of the pin 1. Accordingly, the input transistor 95 is used to sense or detect the voltage of the pin 1 during normal operating conditions of the IO interface 90. For clarity of the figures, certain circuitry connected to the output node 99 has been omitted.

As shown in FIG. 1C, the protection transistor 98 includes a drain electrically connected to the gate of the input transistor 95. Additionally, the gate of the protection transistor 98 is connected to the ground voltage GND, and the source and body of the protection transistor 98 are connected to the source of the input transistor 95. The protection transistor 98 operates to reduce or limit a gate-to-source voltage of the input transistor 95 during overstress. For example, the protection transistor 98 can be used to shunt charge that reaches the gate of input transistor 95, such as charge capacitively coupled to the input transistor's gate during an ESD event.

Although one specific implementation of an internal circuit is shown, an interface switch can be connected to internal circuits implemented in a wide variety of ways. Accordingly, other implementations are possible.

Additional details of the IO interface 90 can be as described earlier.

Figure 2:
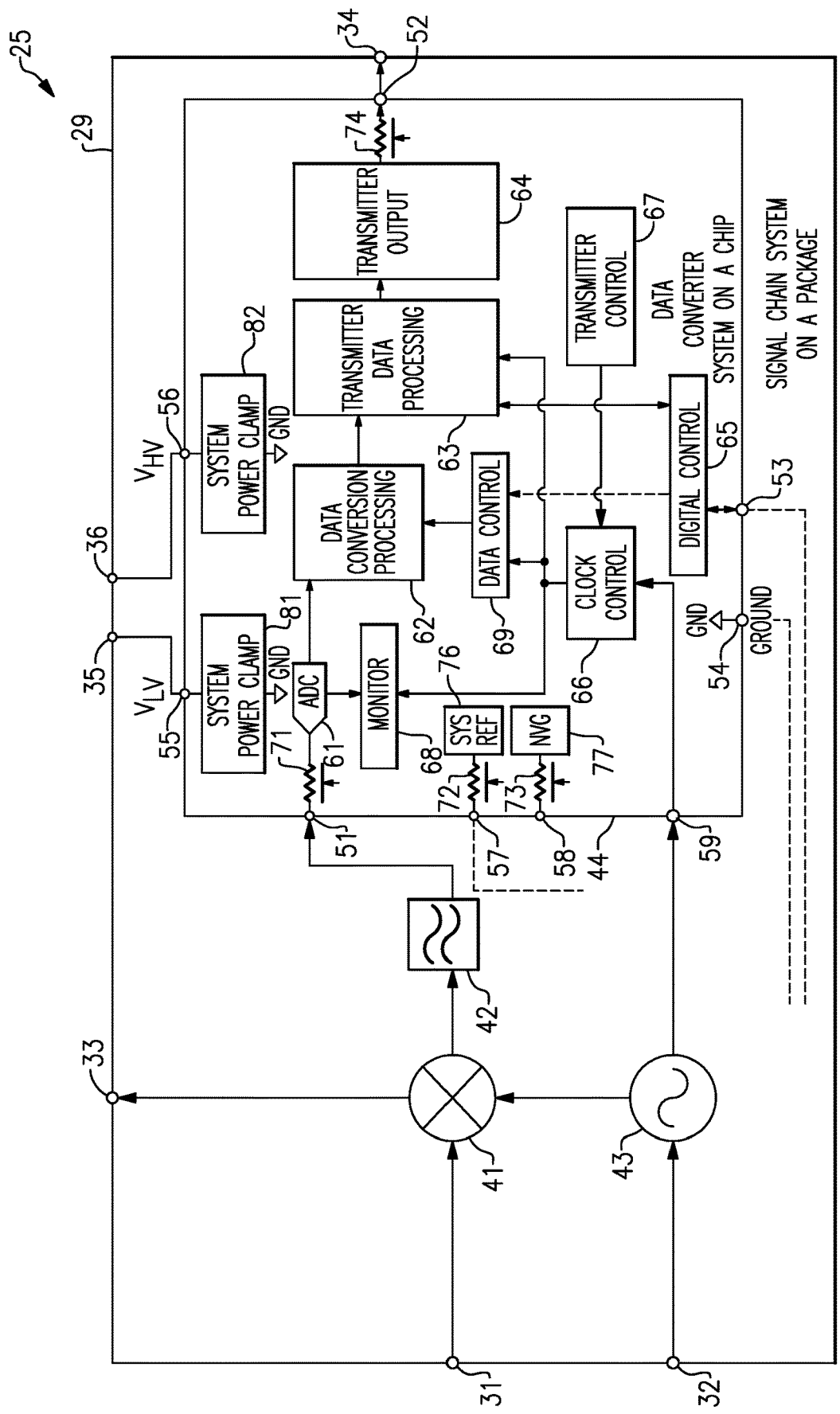
FIG. 2 is a schematic diagram of a signal chain system on a package (SOP) in accordance with one embodiment.

FIG. 2 is a schematic diagram of a signal chain system on a package (SOP) 25 in accordance with one embodiment. The signal chain SOP 25 includes a package substrate 29 including a mixer 41, a filter 42, a local oscillator 43, and a data converter system on a chip (SOC) 44 attached thereto. The signal chain SOP 25 further includes a data package pin 31, a reference clock package pin 32, a mixer output package pin 33, a data converter output package pin 34, a low voltage power supply package pin 35, and a high voltage power supply package pin 36.

Although not illustrated in FIG. 2, the signal chain SOP 25 can include more or fewer components, pins, and/or other structures, and/or can be arranged in other ways. Accordingly, other implementations are possible.

The data converter SOC or data converter IC 44 includes a data input pin 51, a data output pin 52, an interface pin 53, a ground pin 54, a low voltage supply pin 55, a high voltage supply pin 56, a system reference pin 57, a negative voltage generator pin 58, and a clock pin 59. The data converter IC 44 further includes an analog-to-digital converter (ADC) 61, a data conversion processing circuit 62, a transmitter data processing circuit 63, a transmitter output circuit 64, digital control circuit 65, a clock control circuit 66, a transmitter control circuit 67, a monitor circuit 68, a data control circuit 69, a first actively-controlled interface switch 71, a second actively-controlled interface switch 72, a third actively-controlled interface switch 73, a fourth actively-controlled interface switch 74, a system reference circuit 76, a negative voltage generator 77, a first system power clamp 81, and a second system power clamp 82.

As shown in FIG. 2, the ADC 61, the data conversion processing circuit 62, the transmitter data processing circuit 63, and the transmitter output circuit 64 operate in cascade in a data conversion signal path of the data converter IC 44. The transmitter output circuit 64 is also referred to herein as a data communication driver. The data conversion signal path serves to convert analog data received from the filter 42 on the data input pin 51 to digital data provided on the data output pin 52. Additionally, the digital control circuit 65, the clock control circuit 66, the transmitter control circuit 67, the monitor circuit 68, and the data control circuit 69 collectively operate to control data conversion operations along the signal path.

The first system power clamp 81 is connected between a low voltage supply $V_{LV}$ received on the low voltage supply pin 55 and a ground voltage GND received on the ground pin 54. Additionally, the second system power clamp 82 is connected between a high voltage supply $V_{HV}$ received on the high voltage supply pin 56 and the ground voltage GND. The first and second system power clamps 81, 82 serve to protect the power supply networks of the data converter IC 44 from damage from overstress. Although the illustrated embodiment includes two power supply domains, the teachings herein are applicable to ICs implemented with more or fewer power supply domains.

As shown in FIG. 2, certain pins of the IO interface of the data converter IC 44 include actively-controlled interface switches. For example, in the illustrated embodiment, the first actively-controlled interface switch 71 is connected between the data input pin 51 and the ADC 61, the second actively-controlled interface switch 72 is connected between the system reference pin 57 and the system reference circuit 76, the third actively-controlled interface switch 73 is connected between the negative voltage generator pin 58 and the negative voltage generator 77, and the fourth actively-controlled interface switch 74 is connected between the data output pin 52 and the transmitter output circuit 64.

Although the illustrated embodiment includes four actively-controlled interfaces switches, an IC can include more or fewer actively-controlled interface switches. For example, more or fewer and/or a different combination of IC interface pins can include actively-controlled interface switches.

The interface switches 71-74 have resistances that are actively controlled to dynamically change an amount of pin impedance based on whether or not overstress conditions are present. For example, during normal operating conditions, the interface switches 71-74 operate with low resistance and corresponding superior signaling performance characteristics. However, in response to detection of a transient overstress event, the interface switches 71-74 are actively controlled to provide high resistance and corresponding heightened overstress protection.

For clarity of the figures, circuitry used for active control of the interface switches 71-74 is omitted. However, the interface switches 71-74 can be implemented in accordance with the teachings herein. For example, one or more overstress detection and active control circuits (provided, for instance, between the $V_{LV}$ and GND and/or $V_{HV}$ and GND) can actively control the resistance of the interface switches 71-74. In certain implementations, such overstress detection and active control circuits also generate clamp activation control signal(s) for selectively activating the first system power clamp 81 and/or the second system power clamp 82.

In one embodiment, the interface switch 74 has a low resistance value (when in a low impedance state when overstress is not present) of less about 1Ω.

Although the SOP 25 illustrates one example of an electronic communication system that can include an IO interface having active feedback controlled interface switch resistance, a wide variety of IO interfaces can include actively controlled interface switches. Accordingly, other implementations are possible.

Figure 3A:
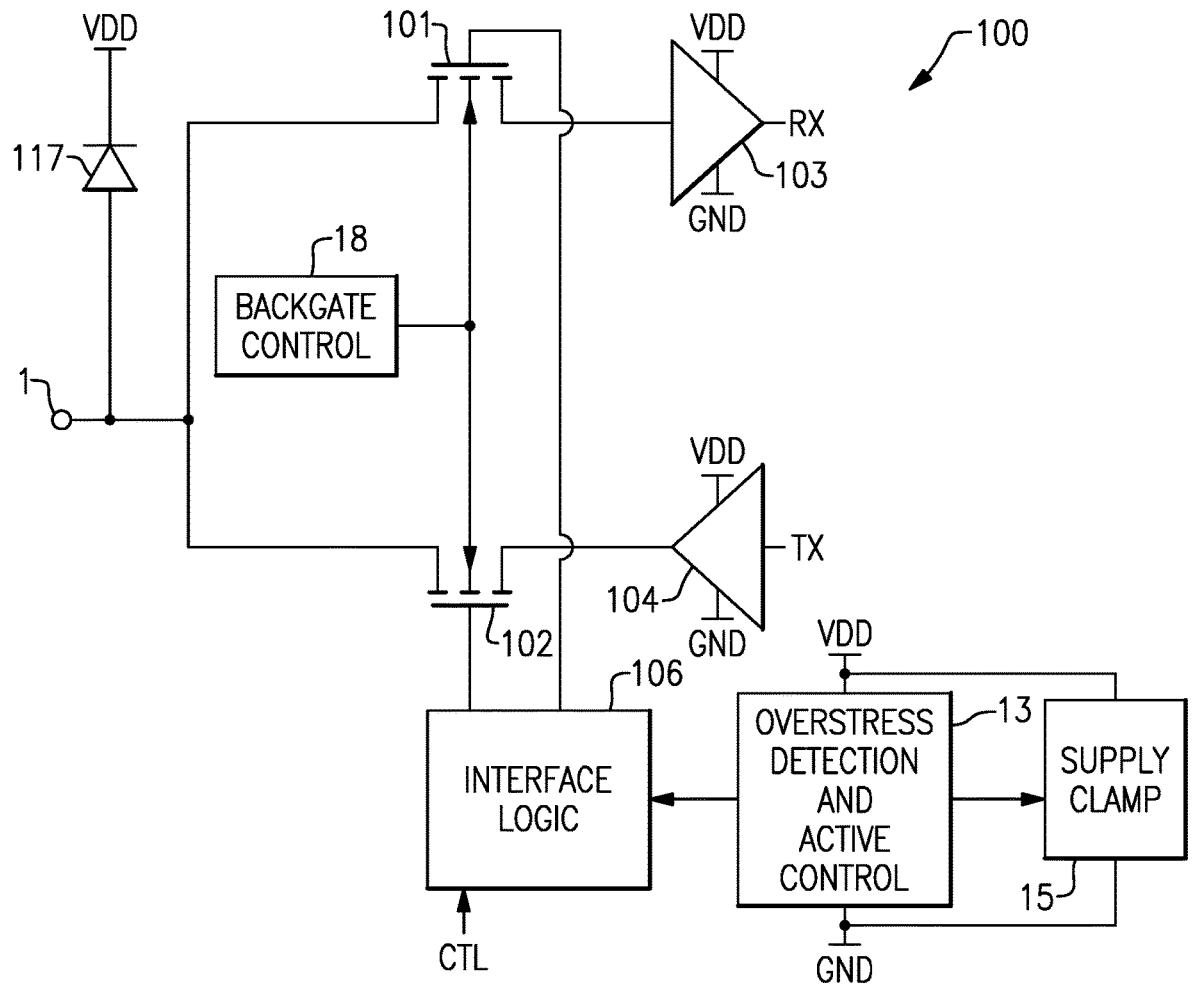
FIG. 3A is a schematic diagram of another embodiment of an IO interface having active feedback controlled interface switch resistance.

FIG. 3A is a schematic diagram of another embodiment of an IO interface 100 having active feedback controlled interface switch resistance. The IO interface 100 includes a pin 1, an overstress detection and active control circuit 13, a supply clamp 15, a backgate control circuit 18, a first interface transistor switch 101, a second interface transistor switch 102, a receiver circuit 103, a transmitter or driver circuit 104, an interface logic circuit 106, and a protection diode 117.

The first interface transistor switch 101 is electrically connected between the pin 1 and an input to the receiver circuit 103. Additionally, the first interface transistor switch 101 includes a body that receives a body voltage from the backgate control circuit 18, and a gate that receives a first interface resistance control signal from the interface logic circuit 106. The second interface transistor switch 102 is electrically connected between the pin 1 and an output of the driver 104. Additionally, the second interface transistor switch 102 includes a body that receives the body voltage from the backgate control circuit 18, and a gate that receives a second interface resistance control signal from the interface logic circuit 106. In the illustrated embodiment, the first and second interface transistor switches 101-102 are n-type FETs. However, other implementations are possible, such as implementations using p-type FETs or implementations using a combination of n-type FETs and p-type FETs.

The overstress detection and active control circuit 13 is electrically connected between a power supply voltage VDD and a ground voltage GND. As shown in FIG. 3A, the overstress detection and active control circuit 13 generates a clamp activation signal for the supply clamp 15, thereby selectively turning on the supply clamp 15 to provide a discharge path from the power supply voltage VDD to the ground voltage GND in response to detection of a transient overstress event.

The illustrated overstress detection and active control circuit 13 also generates an active control signal, which is used to selectively increase the resistance of the first and second interface transistor switches 101-102 when overstress conditions are present. As shown in FIG. 3A, the active control signal is provided to the interface logic circuit 106, which is implemented to control the gate voltages of the first and second interface transistor switches 101-102 to increase their resistance in response to the overstress detection and active control circuit 13 indicating that a transient overstress event has been detected.

In certain implementations, the interface logic circuit 106 includes combinational logic that digitally controls the interface resistance control signals to a logic "1" or logic "0" value based on a state of the active control signal from the overstress detection and active control circuit 13. For example, in an implementation using NFET interface switches, the combinational logic can control the interface resistance control signals to logic "0" values when the active control signal indicates a transient overstress event is present. Additionally, in an implementation using PFET interface switches, the combinational logic can control the interface resistance control signals to logic "1" values when the active control signal indicates a transient overstress event is present. In configurations in which the active control signal generated by the overstress detection and active control circuit 13 is a digital signal, the presence of a transient overstress event can be indicated by either a logic "1" value or a logic "0" value, depending on implementation.

As shown in FIG. 3A, the interface logic circuit 106 also receives a transmit/receive (T/R) control signal CTL, which is used for control of transmit and receive operations during normal operation of the IC when overstress conditions are not present. The T/R control signal CTL can be used to selectively connect the pin 1 to the receive circuit 103 such that the receiver circuit 103 generates receive data RX based on the signal level of the pin 1. Additionally, the T/R control signal CTL can be used to selectively connect the pin 1 to the driver circuit 103 such that the driver circuit 103 controls the signal level of the pin 1 based on transmit data TX.

Accordingly, in the illustrated embodiment, the active control signal from the overstress detection and active control circuit 13 serves as one of several inputs to the interface logic circuit 106, which selectively turns on or off the interface transistor switches 101-102.

The illustrated embodiment advantageously uses interface switches for control of both overstress protection and transmit/receive operations. Accordingly, the first and second interface transistor switches 101-102 are advantageously shared for both controlling transmit and/or receive operations as well as to provide enhanced protection from overstress.

As shown in FIG. 3A, the protection diode 117 includes an anode electrically connected to the pin 1 and a cathode electrically connected to the power supply voltage VDD. The protection diode 117 enhances protection of the pin 1 from overstress by providing a discharge path from the pin 1 to the power supply voltage VDD in response to overstress conditions that increase the voltage of the pin 1 above the power supply voltage VDD.

Additional details of the IO interface 100 can be similar to those described earlier.

Figure 3B:
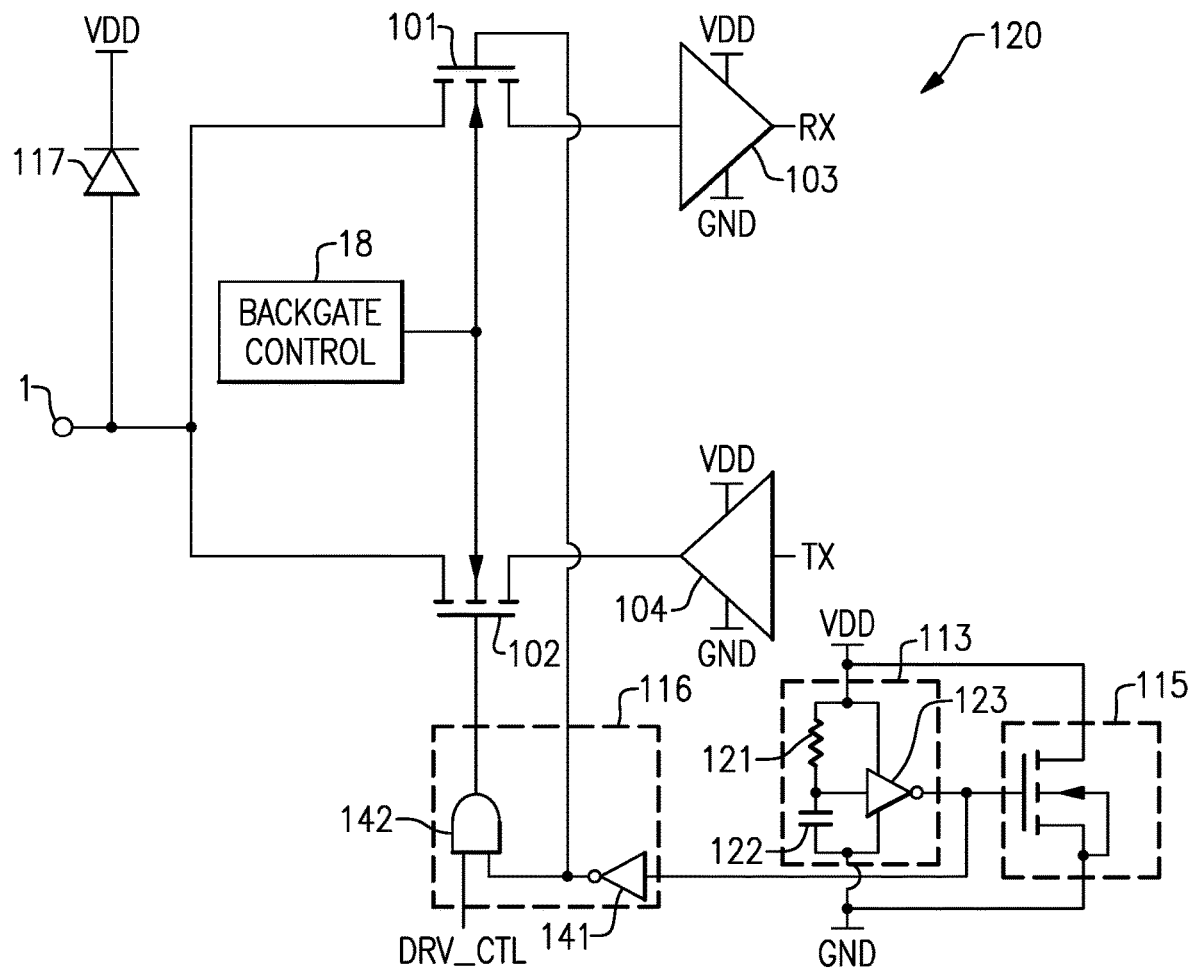
FIG. 3B is a schematic diagram of another embodiment of an IO interface having active feedback controlled interface switch resistance.

FIG. 3B is a schematic diagram of another embodiment of an IO interface 120 having active feedback controlled interface switch resistance. The IO interface 120 includes a pin 1, a backgate control circuit 18, a first interface transistor switch 101, a second interface transistor switch 102, a receiver circuit 103, a driver circuit 104, an overstress detection and active control circuit 113, a supply clamp 115, an interface logic circuit 116, and a protection diode 117.

The IO interface 120 of FIG. 3B is similar to the IO interface 100 of FIG. 3A, except that the IO interface 120 of FIG. 3B illustrates specific implementations of an overstress detection and active control circuit, of a supply clamp, and of an interface logic circuit.

The illustrated overstress detection and active control circuit 113 includes a detection resistor 121, a detection capacitor 122, and an active control inverter 123. The detection resistor 121 and the detection capacitor 122 are electrically connected in series between the power supply voltage VDD and the ground voltage GND. Additionally, an intermediate node between the detection resistor 121 and the detection capacitor 122 generates a detection signal that serves as an input to the active control inverter 123. The output of the active control inverter 123 is used to provide both a clamp activation signal for the supply clamp 115 and an active control signal for the interface logic circuit 116.

Although one specific implementation of an overstress detection and active control circuit is shown, the teachings herein are applicable to overstress detection and active control circuits implemented in a wide variety of ways.

The illustrated supply clamp 115 includes a clamp transistor 131 having a drain electrically connected to the power supply voltage VDD, a gate that receives the clamp activation signal, and a source and body electrically connected to the ground voltage GND. The clamp transistor 131 activates to provide a discharge path from the power supply voltage VDD to the ground voltage GND in response to the overstress detection and active control circuit 113 detecting an overstress condition. Although one specific implementation of a supply clamp is shown, a supply clamp can be implemented in other ways. For example, in another embodiment, a supply clamp includes a bipolar transistor. In yet another embodiment, a supply clamp includes two or more bipolar and/or field-effect transistors in series to enhance power handling.

In the illustrated embodiment, the interface logic circuit 116 includes an interface logic inverter 141 and an interface logic AND gate 142. As shown in FIG. 3B, the interface logic inverter 141 logically inverts the active control signal from the overstress detection and active control circuit 113 to generate a first interface resistance control signal. Additionally, the first interface resistance control signal controls the gate of the first interface transistor switch 101. Furthermore, the interface logic AND gate 142 generates a second interface resistance control based on an AND operation of the first interface resistance control signal and a drive control signal DRV_CTL. Additionally, the second interface resistance control signal controls the gate of the second interface transistor switch 102.

During normal operation of the IO interface 120, the first interface transistor switch 101 is turned on, and the pin 1 is connected to the input of the receiver circuit 103. Additionally, the driver control signal DRV_CTL is used to selectively turn on or turn off the second interface transistor switch 102 to selectively connect or disconnect an output of the driver circuit 104 from the pin 1.

However, when the overstress detection and active control circuit 113 detects an overstress condition, the active control signal is controlled to a logic "1" value, in this example, to indicate presence of overstress. Additionally, when overstress is present, the combinational logic of the interface logic circuit 116 controls the first and second interface resistance control signals to a logic "0" value, regardless of the state of the drive control signal DRV_CTL.

Accordingly, when the active control signal indicates that a transient overstress signal is present, the interface logic control circuit 116 controls the first and second interface transistor switches 101-102 to increase their resistance, thereby providing enhanced protection from overstress. Thus, interface switch resistance is increased and logic inputs used for normal signaling control of the interface switches are overridden when overstress conditions are present. Although one specific implementation of interface logic circuitry shown, an interface logic circuit can be implemented in a wide variety of ways.

In one embodiment, during chip power on, the interface switch state is controlled by an interface logic circuit that receives logic input signals that can, for instance, isolate or connect a driver to a bidirectional pin. However, when the chip is powered down, such as during ESD testing, an active control signal indicating presence of overstress overrides the logic input signals to the interface logic circuit, thereby dominating in defining the gate condition to increase the resistance at the IO signal interface and limit stress current from going into an internal circuit.

Additional details of the IO interface 120 can be similar to those described earlier.

Figure 4:
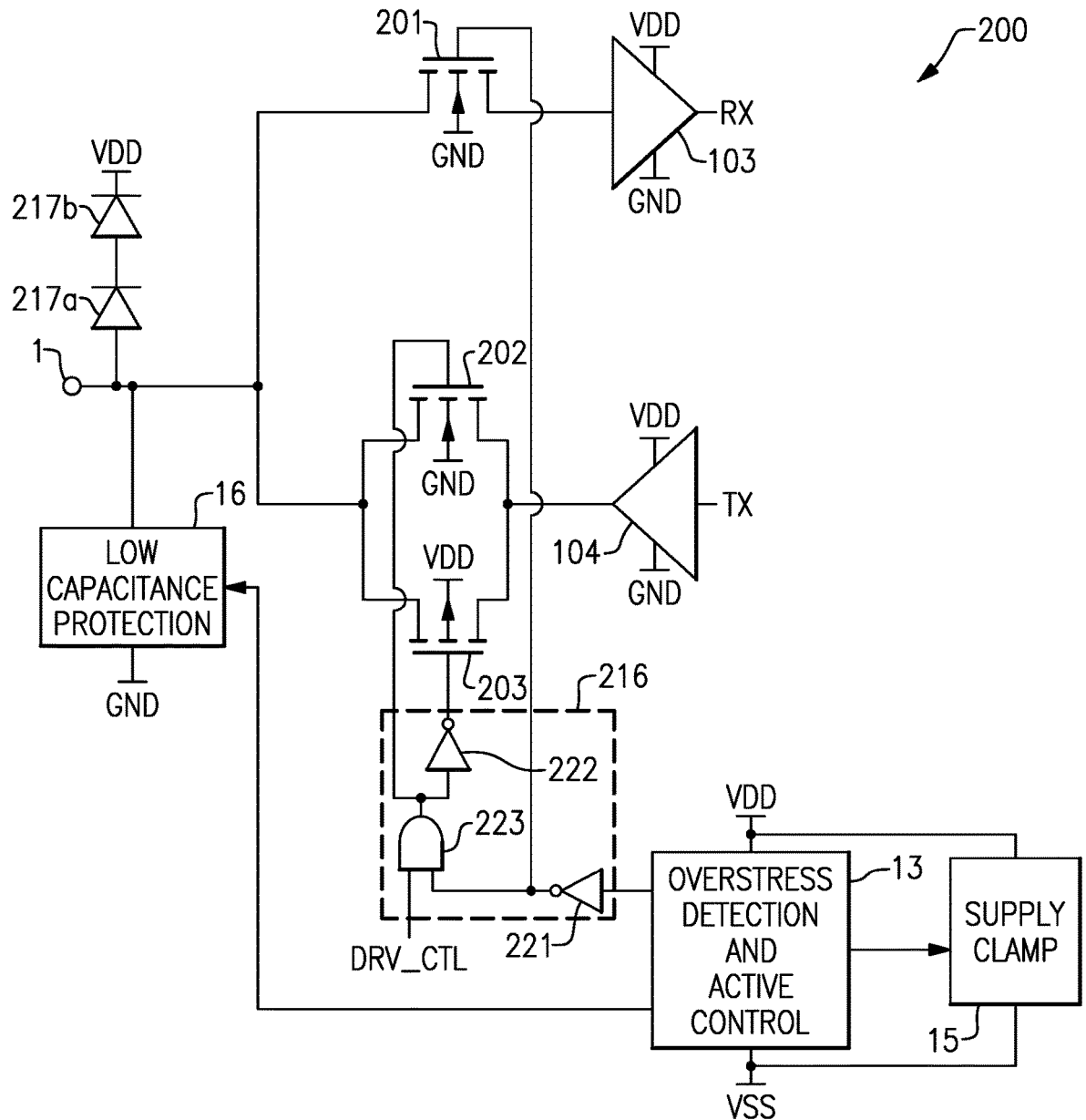
FIG. 4 is a schematic diagram of another embodiment of an IO interface having active feedback controlled interface switch resistance.

FIG. 4 is a schematic diagram of another embodiment of an IO interface 200 having active feedback controlled interface switch resistance. The IO interface 200 includes a pin 1, an overstress detection and active control circuit 13, a supply clamp 15, a low capacitance protection circuit 16, a receiver circuit 103, a driver circuit 104, a first interface transistor switch 201, a second interface transistor switch 202, a third interface transistor switch 203, an interface logic circuit 216, a first protection diode 217a, and a second protection diode 217b.

In the illustrated embodiment, the first and second interface transistor switches 201, 202 are implemented as NFETs, and the third interface transistor switch 203 is implemented as a PFET. As shown in FIG. 4, the second interface transistor switch 202 and the third interface transistor switch are connected in parallel with one another between the pin 1 and an output of the driver circuit 104. Including a parallel combination of a PFET and an NFET at the output of the driver circuit 104 can provide low switch insertion loss across a wide range of output voltage levels of the driver circuit 104.

In the illustrated embodiment, the bodies of the first and second interface transistor switches 201, 202 are controlled by a ground voltage GND, and the body of the third interface transistor switch 203 is controlled by a power supply voltage VDD. However, other implementations are possible, such as implementations including one or more backgate control circuits.

As shown in FIG. 4, the interface logic circuit 216 includes a first interface logic inverter 221, a second interface logic inverter 222, and an interface logic AND gate 223. The first interface logic inverter 221 logically inverts the active control signal from the overstress detection and active control circuit 13 to generate a first interface resistance control signal that controls the first interface transistor switch 201. Additionally, the interface logic AND gate 223 generates a second interface resistance control based on an AND operation of the first interface resistance control signal and a drive control signal DRV_CTL. Additionally, the second interface resistance control signal controls the gate of the second interface transistor switch 202. Additionally, the second interface logic inverter 222 logically inverts the second interface resistance control signal to generate a third interface resistance control signal that controls the third interface transistor switch 203. Although one specific implementation of interface logic circuitry shown, an interface logic circuit can be implemented in a wide variety of ways.

In the illustrated embodiment, the first protection diode 217a and the second protection diode 217b are electrically connected in series between the pin 1 and the power supply voltage VDD. By including multiple protection diodes in series, an amount of parasitic capacitive loading on the pin 1 is reduced relative to a configuration including one protection diode. However, including multiple protection diodes also reduces an amount of protection provided by the diodes by increasing a trigger voltage at which a conductive path from the pin 1 to the power supply voltage VDD is activated.

Additional details of the IO interface 200 can be similar to those described earlier.

Figure 5A:
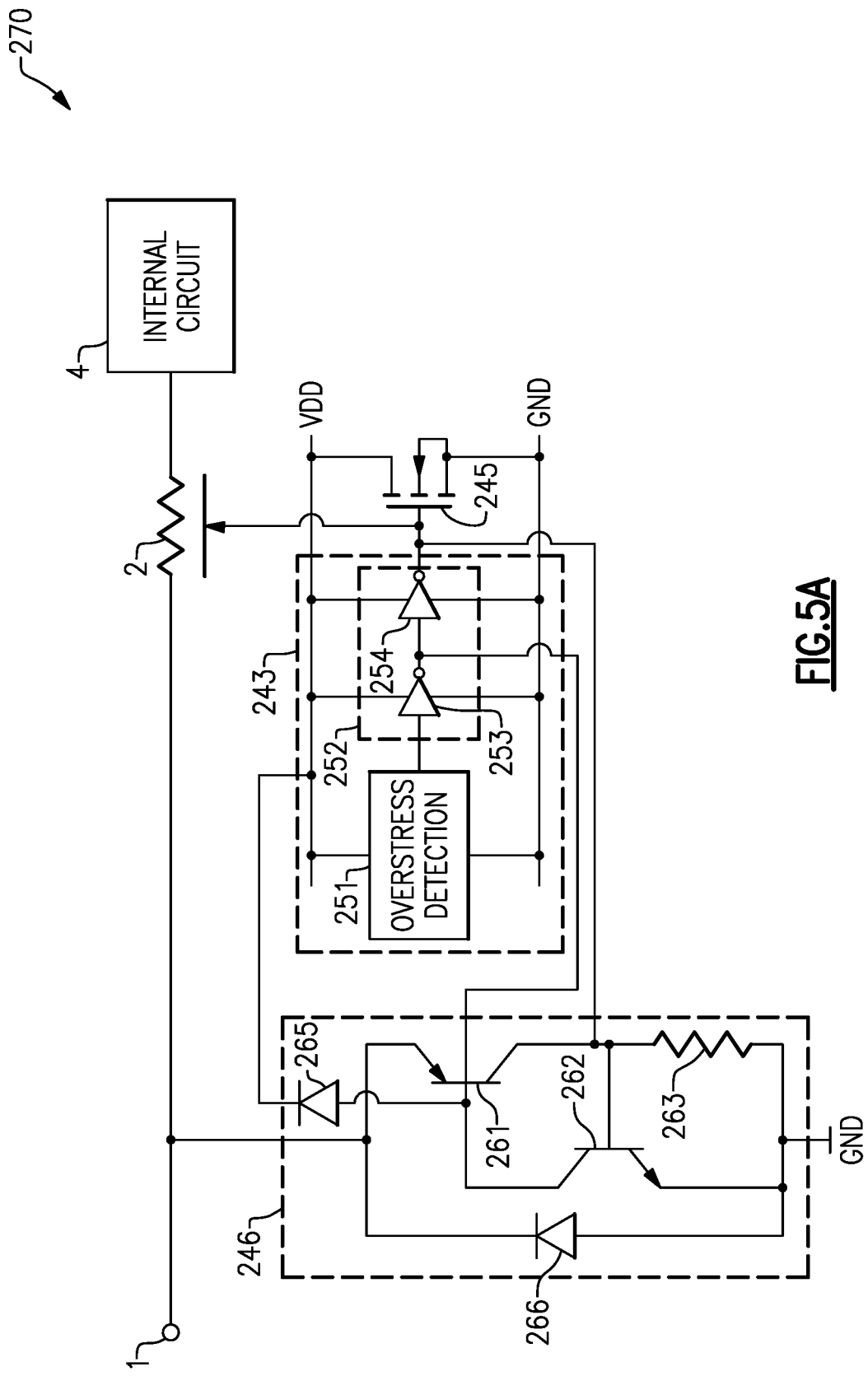
FIG. 5A is a schematic diagram of another embodiment of an IO interface having active feedback controlled interface switch resistance.

FIG. 5A is a schematic diagram of another embodiment of an IO interface 270 having active feedback controlled interface switch resistance. The IO interface 270 includes a pin 1, an interface switch 2, an internal circuit 4, an overstress detection and active control circuit 243, a supply clamp transistor 245, and a low capacitance protection circuit 246.

As shown in FIG. 5A, the overstress detection and active control circuit 243 includes an overstress detection circuit 251, which can be implemented in a variety of ways. In one example, the overstress detection circuit 251 includes a capacitor and a resistor connected in series between the power supply voltage VDD and the ground voltage GND. However, other implementations are possible. The overstress detection circuit 251 further includes an active control circuit 252 including a first active control inverter 253 and a second active control inverter 254, in this embodiment.

The first active control inverter 253 inverts a detection signal generated by the overstress detection circuit 251 to generate a first trigger signal for the low capacitance protection circuit 246. Additionally, the second active control inverter 254 inverts the output of the first active control inverter 254. As shown in FIG. 5A, the output of the second active control inverter 254 serves a variety of functions, including operating as an interface resistance control signal for the interface switch 2, operating as a clamp activation signal for the supply clamp transistor 245, and operating as a second trigger signal for the low capacitance protection circuit 246.

As shown in FIG. 5A, the low capacitance protection circuit 246 includes a PNP bipolar transistor 261, an NPN bipolar transistor 262, a resistor 263, a forward protection diode 265, and a reverse protection diode 266.

The PNP bipolar transistor 261 and the NPN bipolar transistor 262 are cross-coupled, and thus operate as a silicon-controlled rectifier (SCR). An SCR, which is also referred to herein as a thyristor, can be implemented via a scalable layout to aid in providing an amount of overstress protection desired for a particular application and/or implementation. For example, the SCR can have a layout implemented with a unit area that can be scaled to provide custom protection and/or loading control at the pin 1.

In certain implementations herein, an SCR receives one or more trigger signals used to selectively modify the SCR's protection characteristics. For example, control over the SCR's latching/triggering and latch release can be realized via trigger signals that provide local control at the base(s) of the SCR's embedded bipolar transistors. For example, the base of the SCR's NPN bipolar transistor 262 and/or the base of the SCR's PNP bipolar transistor 261 can receive a trigger signal.

By controlling an SCR's protection characteristics using one or more trigger signals, both fast activation time and high current handling capability per unit area can be achieved. In certain implementations, an SCR controlled using one or more trigger signals can turn on during overstress conditions to provide transient overstress protection at a voltage below normal circuit operating voltage levels, for instance, a voltage less than a maximum nominal operating voltage of the pin 1.

In contrast, an SCR that relies on native junction breakdown may have not have a sufficiently fast activation time, and thus circuitry protected by such an SCR can be exposed to voltage overshoot that may lead to damage. Moreover, an SCR that triggers via direct junction breakdown can be implemented with an activation voltage that has a sufficiently high voltage margin to reduce the likelihood that the SCR is inadvertent triggered in the presence of normal circuit operating voltage levels. Although implementing the SCR with activation voltage margin can reduce or eliminate false triggering, the activation voltage margin can further degrade the SCR's turn-on speed.

In the illustrated embodiment, the forward protection diode 265 is connected between the base of the PNP bipolar transistor 265 and the power supply voltage VDD. When the voltage of the pin 1 is sufficiently large, the PNP bipolar transistor's emitter-to-base junction and the forward protection diode 265 can become forward biased to provide protection from the pin 1 to the power supply voltage VDD. By connecting the anode of the forward protection diode 265 to the base of the PNP bipolar transistor 261, capacitive loading of the pin 1 is reduced relative to a configuration in which the anode of the forward protection diode 265 is directly connected to the pin 1.

The reverse protection diode 266 includes an anode electrically connected to the ground voltage GND and a cathode electrically connected to the pin 1, and activates in response to overstress conditions that increase the voltage of the ground voltage GND relative to the voltage of the pin 1.

The resistor 263 is electrically connected across the base-to-emitter junction of the NPN bipolar transistor 262. The resistor 263 aids in tuning SCR performance characteristics, such as trigger and/or holding voltages, to desirable values. However, in other implementations the resistor 263 is omitted.

Additional details of the IO interface 270 can be similar to those described earlier.

Figure 5B:
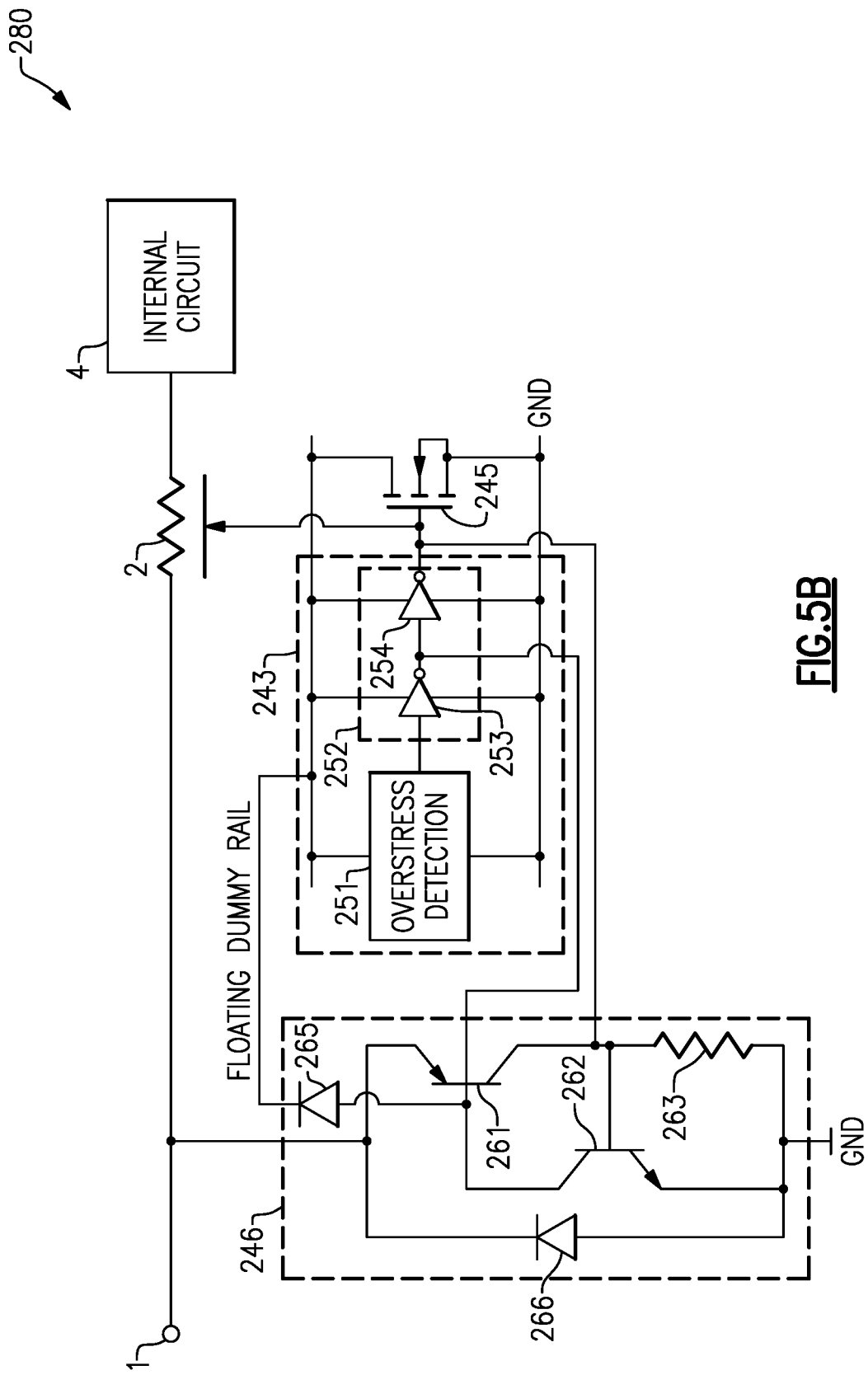
FIG. 5B is a schematic diagram of another embodiment of an IO interface having active feedback controlled interface switch resistance.

FIG. 5B is a schematic diagram of another embodiment of an IO interface 280 having active feedback controlled interface switch resistance. The IO interface 280 includes a pin 1, an interface switch 2, an internal circuit 4, an overstress detection and active control circuit 243, a supply clamp transistor 245, and a low capacitance protection circuit 246.

The IO interface 280 of FIG. 5B is similar to the IO interface 270 of FIG. 5A, except that the IO interface 280 illustrates an implementation including a floating dummy rail rather than a connection to the power supply voltage VDD. As shown in FIG. 5B, the overstress detection and active control circuit 243 is electrically connected between the floating dummy rail and the ground voltage GND. Additionally, the supply clamp 245 is electrically connected between the floating dummy rail and the ground voltage GND. Furthermore, the forward protection diode 265 includes an anode electrically connected to the base of the PNP bipolar transistor 261 and a cathode electrically connected to the floating dummy rail.

As shown in FIG. 5B, the floating dummy rail, which corresponds to one implementation of the second reference voltage $V_2$ of FIG. 1A, is generated based on rectifying an internal voltage of the low capacitance or secondary protection circuit 246.

Accordingly, in the illustrated embodiment, the floating dummy rail corresponds to a node of the integrated circuit that is not directly controlled by an external voltage from a pin. In the illustrated embodiment, the floating dummy rail operates at about two diode drops below a maximum operating voltage of the pin 1. However, other implementations are possible.

The pin 1 of the IO interface 280 includes protection circuits that provide discharge paths to the ground voltage GND, while avoiding discharge paths to a power supply voltage VDD. By implementing the IO interface 280 in this manner, the signal voltage of the pin 1 can safely exceed the power supply voltage VDD. Additionally, the pin 1 is isolated from the supply voltage VDD, and thus is shielded from supply noise. In contrast, when a protection device is included directly between the pin 1 and the power supply voltage VDD, supply noise can couple to the pin via the protection device. Furthermore, when direct protection from the pin 1 to the power supply voltage VDD is omitted, relatively low parasitic capacitance at the pin 1 can be achieved. Accordingly, the illustrated embodiment can be advantageously used in implementations in which a pin-to-supply protection device is undesirable in view of desired signaling levels, capacitive loading specifications, and/or noise constraints.

Moreover, the illustrated embodiment advantageously provides self-timed activation and activation release of interface impedance control. For example, since the overstress detection circuit 251 is coupled between the floating dummy rail and ground GND, the overstress detection circuit 251 operates to both initially increase the resistance of the interface switch 2 in response to an overstress condition and to automatically decrease the resistance of the interface switch 2 after the overstress condition has passed, irrespective of the power supply voltage VDD. In particular, after passage of the overstress condition, the voltage of the floating dummy rail is pulled down via the diode 265, which in turn causes the overstress detection circuit 251 to lower the resistance of the interface switch 2.

Accordingly, using the floating dummy rail aids the overstress detection circuit 251 in increasing the resistance of the interface switch 2 in response to an overstress condition and subsequently decreasing the resistance of the interface switch 2 after passage of the overstress condition, substantially independent of the power supply voltage VDD. Thus, the illustrated embodiment is particularly advantageous in implementations in which an IO interface is specified to tolerate overstress conditions when the chip is powered.

Additional details of the IO interface 280 can be similar to those described earlier.

Figure 6:
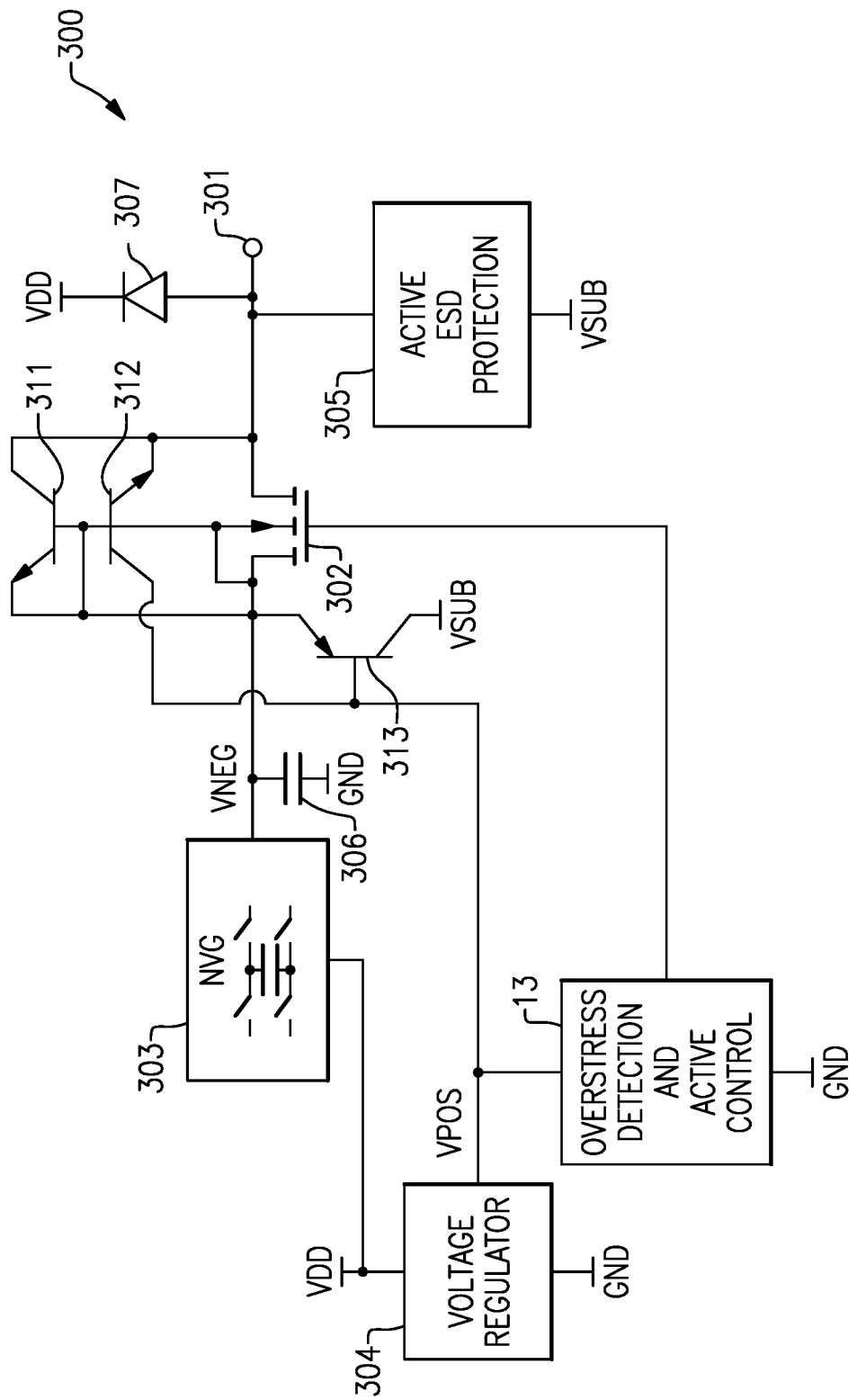
FIG. 6 is a schematic diagram of another embodiment of an IO interface having active feedback controlled interface switch resistance.

FIG. 6 is a schematic diagram of another embodiment of an IO interface 300 having active feedback controlled interface switch resistance. The illustrated IO interface 300 includes an overstress detection and active control circuit 13, a negative voltage pin 301, an interface transistor switch 302, a negative voltage generator 303, a voltage regulator 304, an active ESD protection circuit 305, a decoupling capacitor 306, and a protection diode 307. The illustrated IO interface 280 has also been illustrated to include parasitic bipolar transistors 311-313, which can be present for certain implementations of the interface transistor switch 302.

As shown in FIG. 6, the voltage regulator 304 is electrically connected between the power supply voltage VDD and the ground voltage GND, and provides voltage regulation to generate a positive regulated voltage VPOS that is greater than the ground voltage GND.

The negative voltage generator 303 receives power from the power supply voltage VDD, and generates a negative voltage VNEG having a voltage less than the ground voltage GND. In certain implementations, the negative voltage generator 303 is implemented as a negative charge pump including a plurality of switches and one or more switched capacitors.

The decoupling capacitor 306 is electrically connected between the negative voltage VNEG and the ground voltage GND, and can be used to reduce an output ripple of the negative voltage VNEG.

The negative voltage VNEG can be used for a variety of purposes on-chip. As shown in FIG. 6, the negative voltage VNEG is provided to the negative voltage pin 301 via the interface transistor switch 302, thereby providing the negative voltage VNEG for use off-chip.

The pin 301 can be specified to operate with high current, and thus the IO interface 300 can be specified to operate with very low resistance between the output of the negative voltage generator 303 and the pin 301. Accordingly, it is desirable for the interface transistor switch 302 to operate with low resistance during normal operation of the chip when overstress conditions are not present.

The overstress detection and active control circuit 13 is electrically connected between the positive regulated voltage VPOS and the ground voltage GND. Additionally, the overstress detection and active control circuit 13 generates an interface resistance control signal that is operable to increase the resistance of the interface transistor switch 302 in response to detecting an overvoltage condition between the positive regulated voltage VPOS and the ground voltage GND.

As shown in FIG. 6, the gate of the interface transistor switch 302 receives the interface resistance control signal from the overstress detection and active control circuit 13. Additionally, the body and source of the interface transistor switch 302 are electrically connected to the negative voltage VNEG, and the drain of the interface transistor switch 302 is electrically connected to the negative voltage pin 301. In the illustrated embodiment, the interface transistor switch 302 is n-type.

In certain implementations, the interface transistor switch 302 includes n-type source and n-type drain regions (for example, active or diffusion regions) that are formed in a p-type well, which serves as a body of the interface transistor switch 302. Additionally, an n-type isolation structure (for example, an n-type tub) surrounds the p-type well. Additionally, the n-type isolation structure is electrically connected to the positive regulated voltage VPOS, and is used to isolate the interface transistor switch 302 from a p-type substrate that is biased with a substrate voltage VSUB, which can be, for example, ground.

In such an implementation, the interface transistor switch 302 can include the parasitic bipolar transistors 311-313. The first parasitic NPN bipolar transistor 311 includes an emitter associated with the n-type source of the interface transistor switch 302, a base associated with the p-type body of the interface transistor switch 302, and a collector associated with the n-type drain of the interface transistor switch 302. Additionally, the second parasitic NPN bipolar transistor 312 includes an emitter associated with the n-type drain of the interface transistor switch 302, a base associated with the p-type body of the interface transistor switch 302, and a collector associated with the n-type isolation structure, which is connected to the positive regulated voltage VPOS. Furthermore, the parasitic PNP bipolar transistor 313 includes an emitter associated with the p-type body of the interface transistor switch 302, a base associated with the n-type isolation structure, and a collector associated with the p-type substrate, which is connected to the substrate voltage VSUB.

As shown in FIG. 6, the protection diode 307 includes an anode electrically connected to the negative voltage pin 301 and a cathode electrically connected to the power supply voltage VDD. Additionally, the active ESD protection circuit 305 is electrically connected between the pin 1 and the substrate voltage VSUB.

The IO interface 300 of FIG. 6 illustrates another example of a chip interface that can include one or more actively controlled interface switches. However, the actively controlled interface switches described herein can be used in a wide variety of IO interfaces.

Additional details of the IO interface 300 can be similar to those described earlier.

Figure 7:
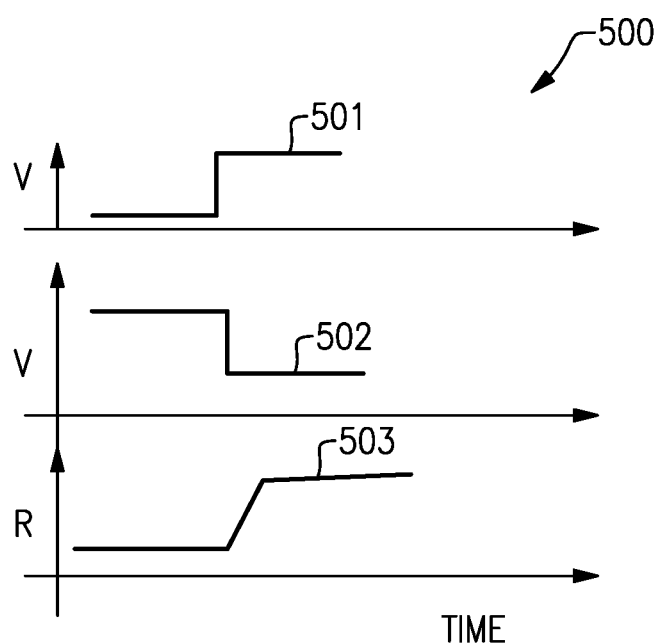
FIG. 7 is a graph of voltage and resistance versus time for one embodiment of an actively controlled interface switch.

FIG. 7 is a graph 500 of voltage and resistance versus time for one embodiment of an actively controlled interface switch. The graph 500 corresponds to example plots in response to an overstress condition.

The graph 500 includes a first plot 501 of voltage versus time corresponding to a clamp activation signal for a supply clamp. As shown by the first plot 501, the supply clamp is activated in response to detection of overstress conditions. The graph 502 further includes a second plot 502 of voltage versus time for the gate voltage of an n-type interface transistor switch. As shown in the FIG. 7, the gate voltage of the n-type interface transistor switched is decreased in response to detection of overstress. The graph 500 further includes a third plot 503 of channel resistance versus time for the n-type interface transistor switch. As shown in FIG. 7, the channel resistance of the n-type interface transistor switch is increased in response to detection of an overstress condition, thereby providing a corresponding increase in pin impedance.

Figure 8A:
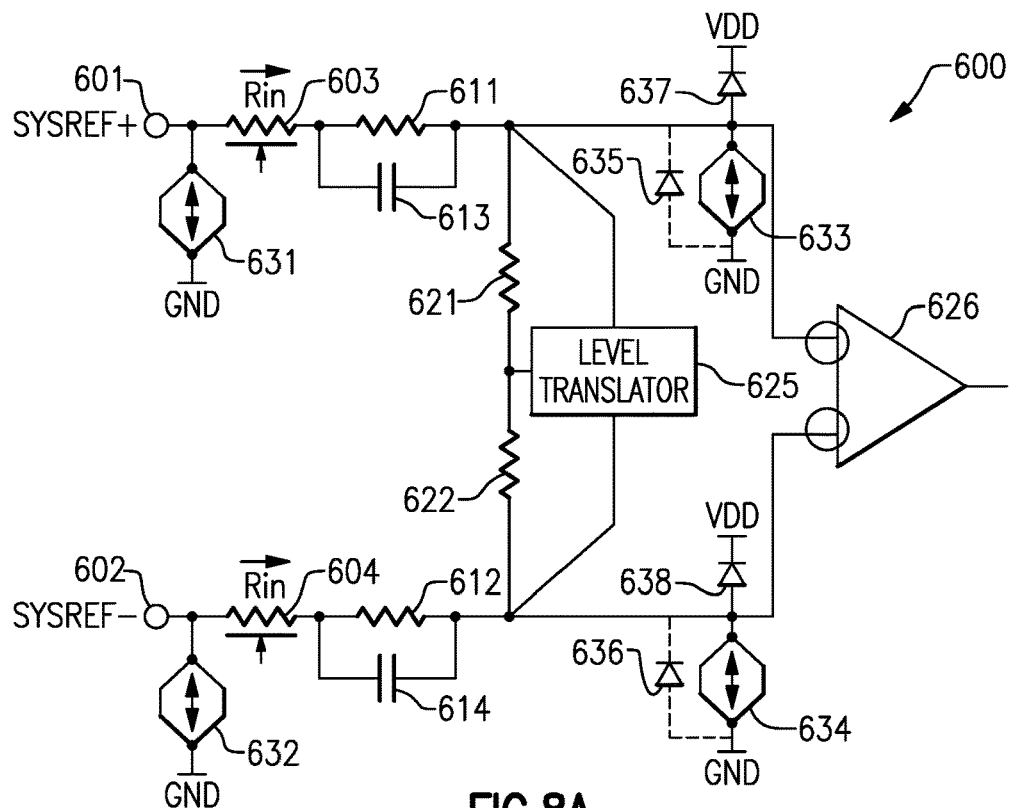
FIG. 8A is a schematic diagram of another embodiment of an IO interface for an IC.

FIG. 8A is a schematic diagram of another embodiment of an IO interface 600 for an IC. The IO interface 600 includes a first system reference pin 601, a second system reference pin 602, a first interface switch 603, a second interface switch 604, a first input resistor 611, a second input resistor 612, a first input capacitor 613, a second input capacitor 614, a first common mode resistor 611, a second common mode resistor 622, a level translator 625, a differential amplifier 626, a first auxiliary protection circuit 631, a second auxiliary protection circuit 632, a third auxiliary protection circuit 633, a fourth auxiliary protection circuit 634, a first protection diode 635, a second protection diode 636, a third protection diode 637, and a fourth protection diode 638. For clarity of the drawings, the figures omit circuitry used to provide active control to the interface switches. However, the interface switches 603-604 can be actively controlled in accordance with the teachings here.

The common mode input voltage of the first and second system reference pins 601-602 can be much higher than the local supply voltage VDD. Thus, the IO interface 600 omits protection circuits directly connected between the supply voltage VDD and the first and second reference pins 601-602. Rather, the first and second auxiliary protection circuits 631-632 are provided between the ground voltage GND and the first and second reference pins 601-602, respectively.

To provide further protection, the IO interface 600 includes the level translator 625, which serves to shift the common mode voltage down below the local supply voltage VDD. Additionally, the IO interface 600 includes the protection diodes 635-638 and the auxiliary protection circuits 633-634, which serve as secondary protection to the differential amplifier 626.

As shown in FIG. 8A, the input resistance provided by the interface switches 603-604 is designated Rin.

The IO interface 600 of FIG. 8A illustrates another example of a chip interface that can include one or more actively controlled interface switches. However, the actively controlled interface switches described herein can be used in a wide variety of IO interfaces.

Figure 8B:
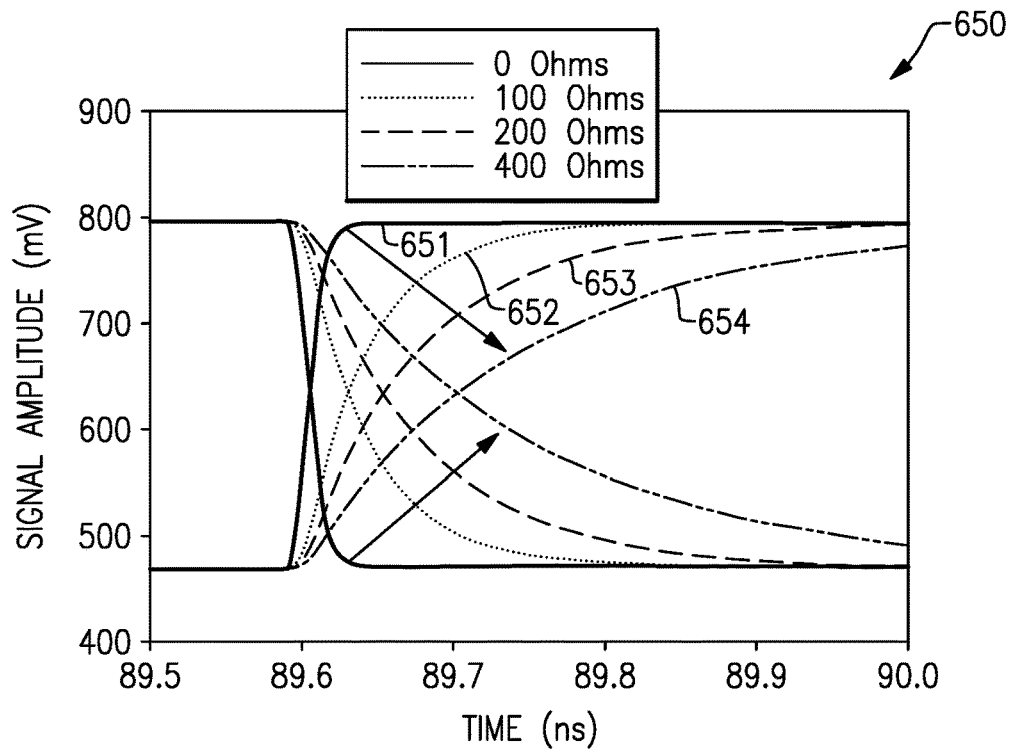
FIG. 8B is a graph of signal amplitude versus time for different values of interface switch resistance.

FIG. 8B is a graph 650 of signal amplitude versus time for different values of interface switch resistance Rin for the IO interface 600 of FIG. 6. The graph 650 includes plots corresponding to transient waveforms in response to a transition of a differential input signal received between the first and second system reference pins 601, 602. The graph includes a first plot 551 of signal amplitude versus time for Rin equal to 0Ω, a second plot 552 of signal amplitude versus time for Rin equal to 100Ω, a third plot 503 of signal amplitude versus time for Rin equal to 200Ω, and fourth plot 504 of signal amplitude versus time for Rin equal to 400Ω.

As shown by FIG. 8B, no resistance or a relatively small resistance Rin can be desirable for the interface switches 603-604. For example, the IO interface 600 can be specified to operate with rise time constraints (for instance, a rise time of 100 ps or less), and large values of Rin can prevent the IO interface 600 from meeting such specifications.

However, a low resistance value for Rin can weaken the robustness of the IO interface 600 to overstress. For example, the differential amplifier 626 can include voltage-sensitive circuitry, such as fine geometry MOS transistors and/or FinFETs that are susceptible to damage from relatively small amounts of overstress. Additionally, the inability to include primary protection circuits to the power supply voltage VDD directly at the system reference pins 601-602 can increase the sensitivity of the IO interface 600 to overstress conditions.

Accordingly, although the resistance Rin can be undesirable from a signaling performance perspective, the resistance can also enhance the robustness of the IO interface 600 to overstress. For example, the resistance Rin can protect the inputs of the differential amplifier 626 from damage during an ESD event by inhibiting stress current from flowing into or out of the differential amplifier's inputs.

By actively controlling the interface switches 603-604, the benefits of both robust overstress protection and excellent signaling performance can be achieved.

In certain implementations herein, an interface switch for a clock signal pin receives a clock signal of at least about 10 GHz, and operates during normal operating conditions with a low resistance value of less than about 500 mΩ to inhibit signaling errors in response to a transition of the clock signal.

Although FIG. 8B illustrates one example of simulation results for an IO interface, other simulation results are possible, including results that depend on implementation, application, and/or processing technology.

Figure 9A:
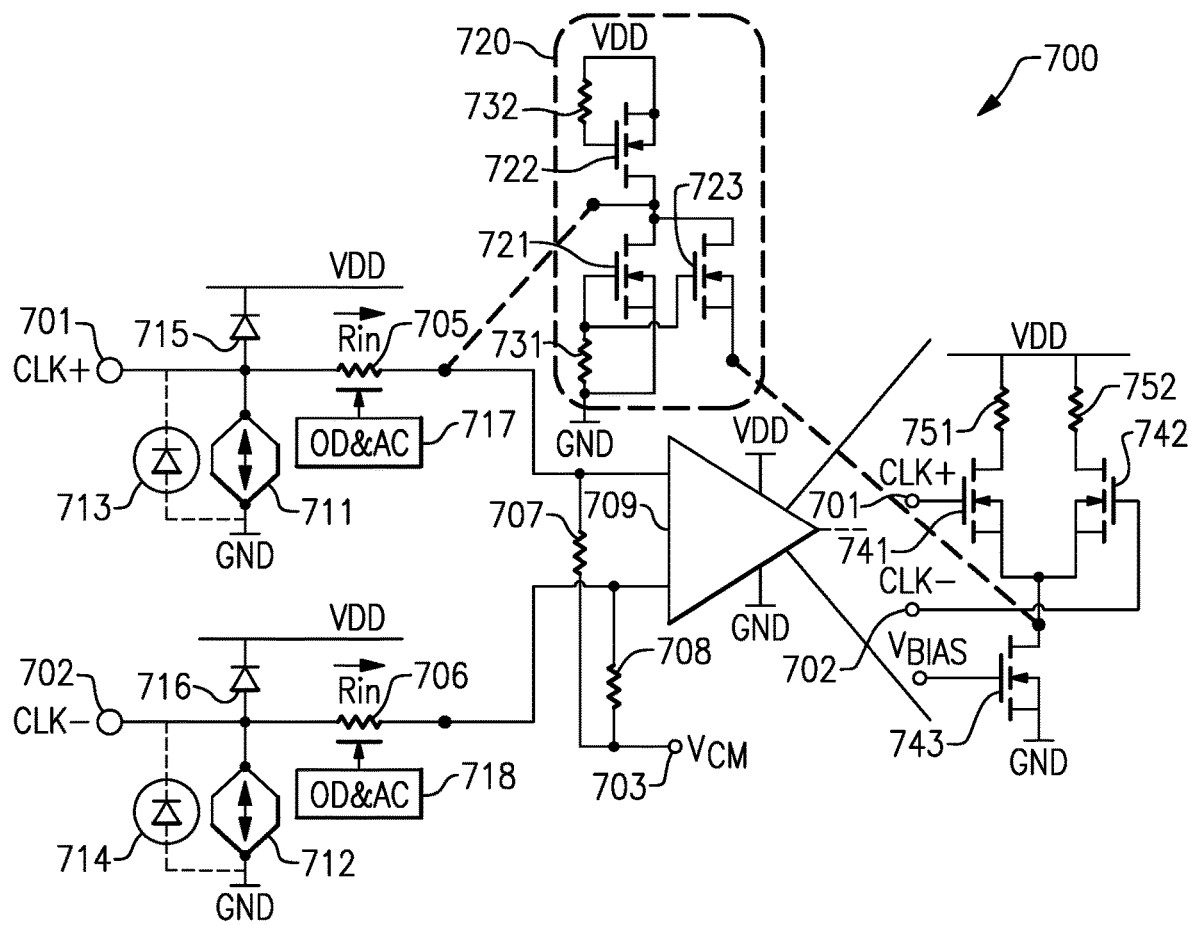
FIG. 9A is a schematic diagram of another embodiment of an IO interface for an IC.

FIG. 9A is a schematic diagram of another embodiment of an IO interface 700 for an IC. The IO interface 700 includes a first clock pin 701, a second clock pin 702, a common mode pin 703, a first interface switch 705, a second interface switch 706, a first common mode resistor 707, a second common mode resistor 708, a differential amplifier 709, a first auxiliary protection circuit 711, a second auxiliary protection circuit 712, a first reverse protection diode 713, a second reverse protection diode 714, a first forward protection diode 715, a second forward protection diode 716, a first overstress detection and active control (OD&AC) circuit 717, and a second overstress detection and active control circuit 718. The IO interface 700 further includes a secondary protection circuit 720, which is connected to a first input of the differential amplifier or clock buffer 709. Although omitted from FIG. 9A for clarity of the figures, a secondary protection circuit can also be included at the second input of the clock buffer 709.

As shown in FIG. 9A, certain circuitry of the clock buffer 709 has been annotated in FIG. 9A. In particular, a first input transistor 741, a second input transistor 742, a bias transistor 743, a first bias resistor 751, and a second bias resistor 752 are shown.

In the illustrated embodiment, the secondary protection circuit 720 is electrically connected between the gate and source of the first input transistor 741, and serves to protect the clock buffer 709 from damage by limiting the gate-to-source voltage of the first input transistor 741.

The illustrated secondary protection circuit 720 includes a first protection transistor 721, a second protection transistor 722, a third protection transistor 723, a first protection resistor 731, and a second protection resistor 732.

As shown in FIG. 9A, the first protection resistor 731 is electrically connected between the gate of the first protection transistor 721 and the ground voltage GND, and the second protection resistor 732 is electrically connected between the gate of the second protection transistor 722 and the power supply voltage VDD. Additionally, the body and source of the first protection transistor 721 are connected to the ground voltage GND, and the drain of the first protection transistor 721 is connected to the gate of the first input transistor 741. Furthermore, the body and source of the second protection transistor 722 are connected to the power supply voltage VDD, and the drain of the second protection transistor 722 is connected to the gate of the first input transistor 741. Additionally, the drain of the third protection transistor 723 is connected to the gate of the first input transistor 741, and the gate of the third protection transistor 723 is connected to the gate of the first protection transistor 721. Furthermore, the source and body of the third protection transistor 723 are connected to the source of the first input transistor 741.

The first and second clock pins 701-702 can receive a high speed differential clock signal. In one embodiment, the first and second clock pins 701-702 are specified to receive a clock signal having a frequency of 10 GHz more. Accordingly, it is desirable for the overstress protection circuitry of the IO interface 700 to have little to no impact on signal rise and fall times and have minimal contribution to jitter.

Accordingly, it is desirable for the resistance Rin to be relatively small, for instance, about 0Ω. However, as Rin is reduced to less than 10Ω, the gates of the clock buffer 709 can be exposed to damage at relatively low levels of overstress, for instance, less than 250 V FiCDM.

By actively controlling the interface switches 705-706, the benefits of both robust overstress protection and excellent signaling performance can be achieved. For example, the resistance of the interface switches 705-706 can be modulated with active control from a desirable low resistance (for instance, less than about 500 mΩ) during normal IC operation to a high resistance (for instance, greater than about 10Ω) when the IC is subject to stress conditions. The independent interface modulation control can achieve protection of the IC's internal circuitry during overstress conditions without compromising high-speed performance metrics associated with interface signaling.

Thus, the first overstress detection and active control circuits 717 and 718 serve to maintain resistance low during normal chip operation when overstress conditions are not present, thereby preventing signal degradation of the type shown in FIG. 8B.

Moreover, providing resistance modulation in this manner can improve clock jitter specifications. For example, Table 1 below shows simulated jitter values at the output of the clock buffer 709 for different input resistance values Rin. The final entry of Table 1 also omits protection diodes and circuits 711-716. Although specific jitter values are shown in Table 1 below, results can vary based on a wide variety of factors, including, for instance, simulation models, parameters, and/or circuit implementation.

TABLE 1

| Rin Value | Output Jitter |
|---|---|
| 400 Ω | 140 fs |
| 200 Ω | 57 fs |
| 100 Ω | 31 fs |
| 25 Ω | 18 fs |
| 0 Ω | 17 fs |
| 0 Ω (protection circuitry omitted) | 16 fs |

By providing resistance modulation via the interface switches 705-706, low jitter operation associated with low input resistance can be achieved. Additional details of the interface 700 can be as described earlier.

Figure 9B:
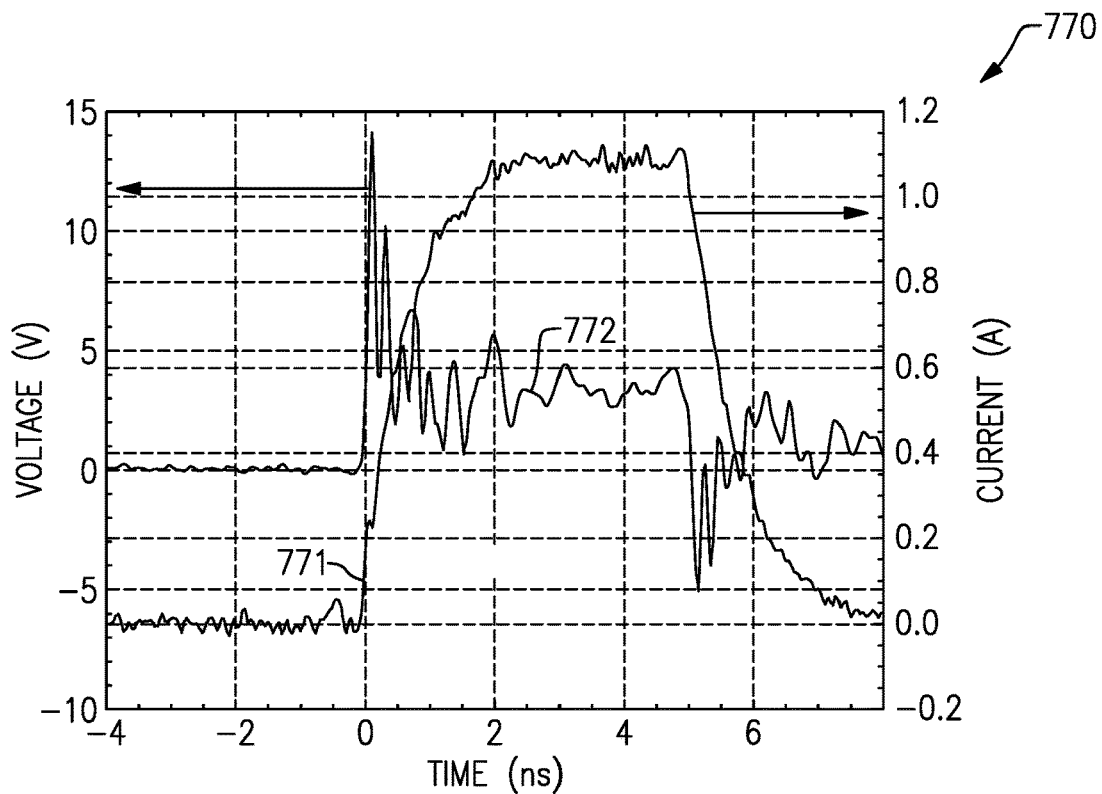
FIG. 9B illustrates one example of a graph of current and voltage versus time for an IO interface.

FIG. 9B illustrates one example of a graph 770 of current and voltage versus time for a high speed low capacitance IO interface protection of FIG. 9A. The graph 770 corresponds to transient measurements of fast pulse characterization between a clock pin and ground for positive stress. The graph 770 includes a first plot 771 of clock pin voltage versus time and a second plot 772 of current through a protection clamp circuitry versus time, in which the protection clamp circuitry corresponds to the components 711, 713, 715, and 720 of FIG. 9A.

Figure 9C:
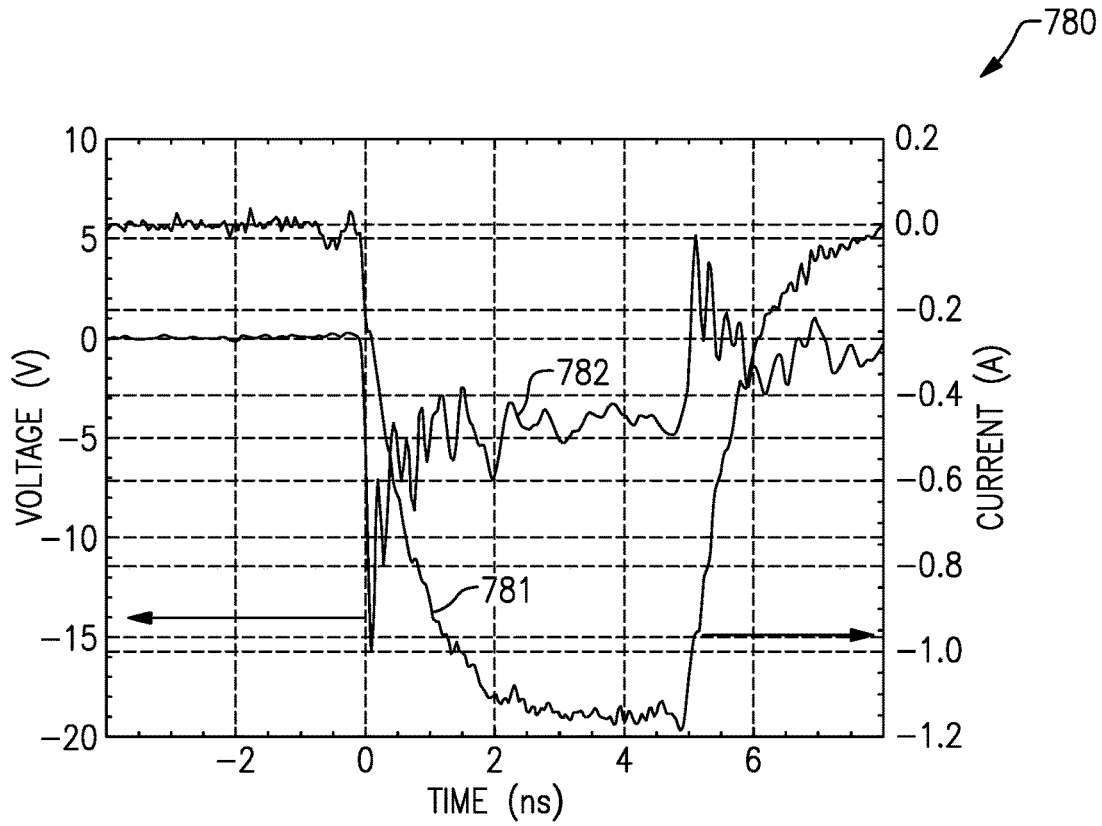
FIG. 9C illustrates another example of a graph of current and voltage versus time for an IO interface.

FIG. 9C illustrates another example of a graph 780 of current and voltage versus time for the IO interface 700 of FIG. 9A. The graph 780 corresponds to simulations of fast pulse characterization between a clock pin and ground for negative stress. The graph 780 includes a first plot 781 of clock pin voltage versus time and a second plot 782 of current through the protection clamp versus time.

Even though the protection clamp responds within 100 ps in this example, overstress directly applied to a sensitive internal circuit (for instance, thin gate oxide or small shallow junction devices) can nevertheless still create damage.

By actively controlling the interface switches 705-706, the benefits of both robust overstress protection and excellent signaling performance can be achieved.

Although FIGS. 9B and 9C illustrates one example of simulation results for an IO interface, other simulation results are possible, including results that depend on implementation, application, and/or processing technology.

Applications

Devices employing the above-described schemes can be implemented into various highly integrated and high speed electronic devices applications. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit with interface resistance modulation, the integrated circuit comprising:
   a pin;
   a first interface switch electrically connected to the pin and having a resistance controlled by an interface resistance control signal;
   a silicon controlled rectifier (SCR) electrically connected between the pin and a first reference voltage and having a trigger input controlled by a trigger control signal;
   an overstress detection and active control circuit configured to detect for presence of an overstress condition between the first reference voltage and a second reference voltage, and to control the trigger control signal to activate the SCR and the interface resistance control signal to modulate a resistance of the first interface switch from a low resistance value to a high resistance value in response to detecting the overstress condition; and
   a diode electrically connected between the trigger input of the SCR and the second reference voltage.

2. The integrated circuit of claim 1, further comprising a ground pin configured to provide the first reference voltage, and a power supply pin configured to provide the second reference voltage.

3. The integrated circuit of claim 2, further comprising a supply clamp electrically connected between the power supply pin and the ground pin, wherein the overstress detection and active control circuit is further configured to selectively activate the supply clamp via the interface resistance control signal.

4. The integrated circuit of claim 1, wherein the low resistance value is less than about 500 mΩ and the high resistance value is greater than about 10Ω.

5. The integrated circuit of claim 1, wherein the pin is a clock pin configured to receive a clock signal of at least 10 GHz, wherein the low resistance value is less than about 500 mΩ to inhibit signaling errors in response to a transition of the clock signal.

6. The integrated circuit of claim 1, wherein the first interface switch is electrically connected between the pin and an internal circuit of the integrated circuit, wherein the pin is a data output pin and the internal circuit is a data communication driver, wherein the low resistance value is less than about 1Ω.

7. The integrated circuit of claim 1, further comprising an input field-effect transistor (FET), a current source, and a protection FET, wherein the first interface switch is electrically connected between the pin and a gate of the input FET, the current source is coupled to a source of the input FET, and the protection FET is coupled across the gate and the source of the input FET.

8. An integrated circuit with interface resistance modulation, the integrated circuit comprising:
   a pin;
   a first interface switch electrically connected to the pin and having a resistance controlled by an interface resistance control signal, wherein the interface switch comprises a field-effect transistor including a gate that receives the interface resistance control signal;
   an overstress detection and active control circuit configured to detect for presence of an overstress condition between a first reference voltage and a second reference voltage, and to control the interface resistance control signal to modulate a resistance of the first interface switch from a low resistance value to a high resistance value in response to detecting the overstress condition; and
   a backgate control circuit configured to control a body voltage of the field-effect transistor.

9. The integrated circuit of claim 8 further comprising an interface logic circuit configured to generate the interface resistance control signal based on an active control signal received from the overstress detection and active control circuit, wherein the active control signal indicates presence of the overstress condition.

10. The integrated circuit of claim 9, wherein the interface logic circuit is configured to control the interface switch based on one or more input logic signals when the active control signal indicates that the overstress condition is not present, and to control the interface switch to the high resistance value when the active control signal indicates that the overstress condition is present.

11. The integrated circuit of claim 9, wherein the overstress detection and active control circuit comprises a detection circuit configured to activate a detection signal in response to detecting the overstress condition, and one or more digital logic circuits configured to generate the active control signal based on the detection signal.

12. The integrated circuit of claim 8, further comprising a secondary protection circuit electrically connected between the pin and the first reference voltage.

13. The integrated circuit of claim 12, wherein the overstress detection and active control circuit is further configured to generate one or more trigger signals that are operable to temporarily modify a protection characteristic of the secondary protection circuit in response to detection of the overstress condition.

14. The integrated circuit of claim 13, wherein the secondary protection circuit comprises an NPN bipolar transistor and a PNP bipolar transistor that are cross-coupled, wherein the one or more trigger signals control at least one of a base of the NPN bipolar transistor or a base of the PNP bipolar transistor.

15. The integrated circuit of claim 12, wherein the second reference voltage is generated based on rectifying an internal voltage of the secondary protection circuit.

16. The integrated circuit of claim 15, wherein the secondary protection circuit pulls down the second reference voltage after passage of the overstress condition such that the overstress detection and active control circuit decreases the resistance of the first interface switch.

17. The integrated circuit of claim 8, further comprising a diode-based protection circuit electrically connected between the pin and the second reference voltage.

18. A method of providing actively-controlled overstress protection for an integrated circuit, wherein the method comprises:
   controlling a resistance of an interface switch that is connected to a pin using an interface resistance control signal;
   detecting for presence of an overstress condition between a first reference voltage and a second reference voltage;
   modulating a resistance of the interface switch from a low resistance value to a high resistance value by controlling the interface resistance control signal in response to detecting the overstress condition;
   activating a silicon controlled rectifier (SCR) connected between the pin and the first reference voltage by controlling a trigger input of the SCR using a trigger control signal in response to detecting the overstress condition; and
   coupling the trigger input of the SCR to the second reference voltage using a diode.

19. The method of claim 18, further comprising activating a supply clamp field-effect transistor (FET) electrically connected between the first reference voltage and the second reference voltage using the interface resistance control signal.

20. The method of claim 18, wherein the interface switch comprises a FET, the method further comprising controlling a body voltage of the FET using a backgate control circuit.

* * * * *